United States Patent
Kim et al.

(10) Patent No.: US 10,063,260 B2
(45) Date of Patent: Aug. 28, 2018

(54) APPARATUS AND METHOD FOR PERMUTATION OF BLOCK CODE IN WIRELESS COMMUNICATION SYSTEM

(71) Applicants: Samsung Electronics Co., Ltd., Gyeonggi-do (KR); Korea University Research and Business Foundation, Seoul (KR)

(72) Inventors: Chanhong Kim, Suwon-si (KR); Inkyu Lee, Seoul (KR); Hoon Lee, Seoul (KR); Ji Hwan Moon, Seoul (KR); Tae Seok Oh, Seoul (KR); Seok Ju Jang, Seoul (KR)

(73) Assignees: Samsung Electronics Co., Ltd., Suwon-si (KR); Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/638,065

(22) Filed: Jun. 29, 2017

(65) Prior Publication Data

US 2018/0006666 A1   Jan. 4, 2018

(30) Foreign Application Priority Data

Jun. 29, 2016   (KR) .................. 10-2016-0081778

(51) Int. Cl.
*H03M 13/29* (2006.01)
*H03M 13/11* (2006.01)
(Continued)

(52) U.S. Cl.
CPC ....... *H03M 13/2906* (2013.01); *H03M 13/05* (2013.01); *H03M 13/1137* (2013.01); *H04L 1/0058* (2013.01)

(58) Field of Classification Search
CPC ............ H03M 13/2906; H03M 13/05; H03M 13/1137; H04L 1/0058
See application file for complete search history.

(56) References Cited

U.S. PATENT DOCUMENTS 7,190,734 B2 *   3/2007   Giannakis ............ H04L 1/0618
                                                          375/260
7,508,891 B2     3/2009   Jung et al.
(Continued)

OTHER PUBLICATIONS

Samsung, "Open-loop transmission scheme for FD-MIMO", 3GPP TSG RAN WG1 Meeting #79, Nov. 17-21, 2014, 3 pages, R1-144757.

(Continued)

*Primary Examiner* — Jean B Corrielus

(57) ABSTRACT

The present disclosure relates to a pre-5$^{th}$-generation (5G) or 5G communication system to be provided for supporting higher data rates Beyond 4$^{th}$-generation (4G) communication system such as long term evolution (LTE). Disclosed are an apparatus and a method for a permutation of a block code in a wireless communication system. A method of operating a transmitting node in a wireless communication system includes: determining a permutation matrix according to a block code scheme; generating symbols corresponding to a plurality of antennas based on the block code scheme and the permutation matrix; and transmitting the symbols to a receiving node through the plurality of antennas. The permutation matrix is determined based on a number of blocks and an arrangement structure of the plurality of antennas, and the number of blocks comprises a number of sub-blocks within a code block corresponding to the permutation matrix.

20 Claims, 30 Drawing Sheets

(51) Int. Cl.
*H04L 1/00* (2006.01)
*H03M 13/05* (2006.01)

(56) References Cited

U.S. PATENT DOCUMENTS

| | | | |
|---|---|---|---|
| 2005/0031062 A1 | 2/2005 | Shim et al. | |
| 2006/0039500 A1* | 2/2006 | Yun | H04L 1/0606 375/299 |
| 2006/0093062 A1* | 5/2006 | Yun | H04B 7/0669 375/267 |
| 2008/0037685 A1* | 2/2008 | Giannakis | H04L 1/0618 375/299 |
| 2008/0260053 A1* | 10/2008 | Yun | H04B 7/0669 375/260 |
| 2016/0241890 A1* | 8/2016 | Park | H04N 21/234 |

OTHER PUBLICATIONS

CATR, "Consideration on open loop transmission for FD-MIMO", 3GPP TSG RAN WG1 Meeting #80, Feb. 9-13, 2015, 2 pages, R1-150598.
Stefania Sesia et al., "LTE—The UMTS Long Term Evolution: From Theory to Practice", John Wiley & Sons, 2009, 794 pages.
Samsung, "Discussions on 8-Tx diversity schemes for LTE-A downlink", 3GPP TSG RAN WG1 Meeting #55bis, Jan. 12-16, 2009, 7 pages, R1-090104.
Seijoon Shim et al., "An efficient antenna shuffling scheme for a DSTTD system," IEEE Communications Letters, vol. 9, No. 2, Feb. 2005, p. 124-126.
Yi Yu et al., "Transmit antenna shuffling for quasi-orthogonal space-time block codes with linear receivers," IEEE Communications Letters, vol. 10, No. 8, Aug. 2006, p. 596-598.
Hamid Jafarkhani, "A quasi-orthogonal space-time block code," IEEE Transactions on Communications, vol. 49, No. 1, Jan. 2001, p. 1-4.
Olav Tirkkonen et. al., "Square-matrix embeddable space-time block codes for complex signal constellations," IEEE Transactions on Information Theory, vol. 48, No. 2, Feb. 2002, p. 384-395.
Olav Tirkkonen et. al., "Minimal Non-Orthogonality Rate 1 Space-Time Block Code for 3+ Tx Antennas," IEEE 6th Int. Symp. on Spread-Spectrum Tech. & Appl., Sep. 6-8, 2000, p. 429-432.
Weifeng Su et. al., "Signal Constellations for Quasi-Orthogonal Space-Time Block Codes With Full Diversity," IEEE Transactions on Information Theory, vol. 50, No. 10, Oct. 2004, p. 2331-2347.
Vahid Tarokh et. al., "Space-Time Block Codes from Orthogonal Designs," IEEE Transactions on Information Theory, vol. 45, No. 5, Jul. 1999, p. 1456-1467.
Joonsuk Kim et. al., "STBC/SFBC for 4 Transmit Antennas with 1-bit Feedback," IEEE 2008, p. 3943-3947.
N. S. Murthy et. al, "Full Rate General Complex Orthogonal Space-Time Block Code for 8-Transmit Antenna," Procedia Engineering (29), 2012, p. 2475-2479.
Ioannis D. Erotokritou, "Space-time block coding for multiple transmit antennas over time-selective fading channels" Louisiana State University, May 2006, 56 pages.
Le C. Tran et. al., "Two new complex orthogonal space time codes for 8 transmit antennas," University of Wollongong, 2004, 9 pages.

* cited by examiner

APPARATUS AND METHOD FOR PERMUTATION OF BLOCK CODE IN WIRELESS COMMUNICATION SYSTEM

CROSS-REFERENCE TO RELATED APPLICATION

The present application is related to and claims priority under 35 U.S.C. § 119(a) to Korean Application Serial No. 10-2016-0081778, which was filed in the Korean Intellectual Property Office on Jun. 29, 2016, the entire content of which is hereby incorporated by reference.

TECHNICAL FIELD

The present disclosure relates to wireless communication, and more particularly to an apparatus and a method for permutation of a block code in a multiple input multiple output (MIMO) wireless environment.

BACKGROUND

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a "beyond 4G Network" or a "post long term evolution (LTE) System."

The 5G communication system is considered to be implemented in higher frequency (mmWave) bands, e.g., 28 GHz or 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems.

In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like.

In the 5G system, Hybrid frequency shift keying (FSK) and quadrature amplitude modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In a current wireless communication system, implementation for or research on a multimedia service of high-speed and large-capacity data transmission is being actively progressed. For transmission of data at a high speed in the wireless communication system, loss due to a characteristic of a mobile communication channel such as a fading phenomenon may be compensated for and inter-user interference may be resolved. One of the technologies to solve the problem is a MIMO technique.

The MIMO technique is classified into an open-loop scheme and a closed-loop scheme depending on the existence of a channel information feedback. The closed-loop scheme has a disadvantage in that an amount of calculations increases since all channel values of a receiving node may be fed back to a transmitting node. In the open-loop scheme, a space time block code (STBC) scheme has been proposed for the purpose of transmission antenna diversity according to a data transmission scheme.

SUMMARY

To address the above-discussed deficiencies, it is a primary object to provide an apparatus and a method for a permutation of a block code in a wireless communication system.

Further, the present disclosure provides an apparatus and a method for a permutation of a block code applied to multiple input multiple output (MIMO) transmission in a wireless communication system.

In addition, the present disclosure provides an apparatus and a method for a permutation to reduce a correlation between antennas in a wireless communication system.

In accordance with an aspect of the present disclosure, a method of operating a transmitting node in a wireless communication system is provided. The method includes: determining a permutation matrix according to a block code scheme; generating symbols corresponding to a plurality of antennas based on the block code scheme and the permutation matrix; and transmitting the symbols to a receiving node through the plurality of antennas.

In accordance with another aspect of the present disclosure, an apparatus of a transmitting node in a wireless communication system is provided. The apparatus includes: a at least one processor configured to determine a permutation matrix according to a block code scheme; and a communication interface configured to generate symbols corresponding to a plurality of antennas based on the block code scheme and the permutation matrix and transmit the symbols to a receiving node through the plurality of antennas.

The permutation matrix may be determined based on a number of blocks and an arrangement structure of the plurality of antennas, and the number of blocks may be a number of sub-blocks within a code block corresponding to the permutation matrix.

The various embodiments may be understood along with the following detailed description and drawings. However, the detailed description below is only an indicative means for describing exemplary embodiments and various detailed matters thereof and does not limit the scope of the present disclosure. Various modifications and changes can be made within the scope of the embodiments.

An apparatus and a method according to various embodiments of the present disclosure can acquire a transmit diversity gain while reducing a correlation between a plurality of antennas in a MIMO system by performing a permutation for block codes. In particular, through an open-loop scheme operating without channel information in a full dimensional MIMO (FD-MIMO) system, the link performance can be improved with reduced system overhead.

The effects obtainable by the present disclosure are not limited to the above-mentioned effects, and other effects not mentioned herein will be clearly understood by those skilled in the art from the following description.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
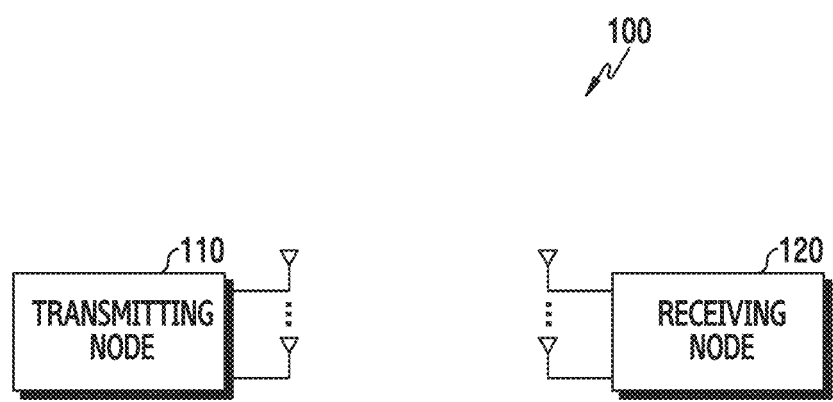
FIG. 1 illustrates an example of a wireless communication system according to various embodiments of the present disclosure.

FIGS. 1 through 29, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The terms used in the present disclosure are only used to describe specific embodiments, and are not intended to limit the present disclosure. A singular expression may include a plural expression unless they are definitely different in a context. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

Hereinafter, in various embodiments of the present disclosure, hardware approaches will be described as an example. However, various embodiments of the present disclosure include a technology that uses both hardware and software and thus, the various embodiments of the present disclosure may not exclude the perspective of software.

The present disclosure relates to an apparatus and a method for a permutation of a block code in a wireless communication system.

The terms referring to an encoding scheme (for example, a space frequency block code (SFBC), or frequency switched transmit diversity (FSTD)), the terms referring to control information (for example, a channel quality feedback or a channel quality indicator (CQI)), the terms referring to network entities, the terms referring to messages, and the terms referring to components within an apparatus are for convenience of description. Accordingly, the present disclosure is not limited to the following terms and other terms having the equivalent technical meaning may be applied to the present disclosure.

In order to handle wireless data traffic that currently rapidly increases, a massive multiple input multiple output (MIMO) technique using a large number of transmission antennas has been discussed in various ways. It has been known that the large number of antennas can improve the performance of a communication system. However, since a channel correlation becomes stronger as a distance between antennas become closer, the large number of antennas may rather result in deteriorating the performance of the communication system.

In order to overcome realistic constraints, a full dimensional MIMO (FD-MIMO) system has been proposed. In the FD-MIMO system, antenna elements are arranged on a two-dimensional plane, so that a larger number of antennas may be arranged in the same space. Accordingly, in the FD-MIMO system, a performance gain of the system may further increase.

The conventional FD-MIMO system has been mainly researched in a closed-loop environment. For the proper operation of the closed-loop scheme, an accurate channel estimation is necessary. Since overhead for the channel estimation is proportional to the number of antennas, applying the closed-loop scheme to the FD-MIMO system that supports scores of antennas or more may cause a performance problem due to a channel estimation error and overhead.

Accordingly, extensively applying the open-loop scheme to the FD-MIMO system is recently discussed. When a SFBC scheme or a space time block code (STBC) scheme is used in the open-loop FD-MIMO system, a transmitting node may acquire improved link performance using simple signal processing alone without channel information. However, when the block code scheme is used, it is most important to find a code matrix having good performance. In the FD-MIMO system having the large number of antennas, a dimension of the code matrix increases, so that it is very difficult to find suitable space-frequency mapping or space-time mapping. For this reason, the block code scheme of the open-loop scheme has been rarely proposed in the FD-MIMO system that considers scores of antennas.

Accordingly, the present disclosure proposes an open-loop transmission method for the FD-MIMO system. More specifically, the present disclosure provides an apparatus and a method for efficiently transmitting a signal by applying a block code and a permutation matrix in the open-loop FD-MIMO system.

FIG. 1 illustrates an example of a wireless communication system according to various embodiments of the present disclosure. Referring to FIG. 1, a wireless communication system 100 includes a transmitting node 110 and a receiving node 120.

The transmitting node 110 and the receiving node 120 may correspond to a user device or a network device. The network device may include a base station, a NodeB (NB), an evolved NodeB (eNB), and the like. The user device may include a terminal, a mobile station, a user equipment, and the like. For example, the transmitting node 110 may correspond to a base station and the receiving node 120 may correspond to a terminal. In another example, the transmitting node 110 may correspond to a terminal and the receiving node 120 may correspond to a base station.

Each of the transmitting node 110 and the receiving node 120 may include a plurality of antennas for data communication. The transmitting node 110 transmits a signal including data to the receiving node 120. For example, the transmitting node 110 may transmit the signal including data to the receiving node 120 in a mmWave band (for example, band of 60 GHz). The transmitting node 110 may use beamforming, massive MIMO, and FD-MIMO techniques to mitigate propagation path loss and increase a radio propagation distance in the mmWave band.

As described above, the transmitting node 110 may be the base station or the terminal and the receiving node 120 may be the terminal or the base station. Hereinafter, for convenience of description, it is assumed that the base station functions as the transmitting node 110 and the terminal functions as the receiving node 120 in the following various embodiments. That is, the following various embodiments assume a situation of downlink communication. However, the present disclosure does not exclude uplink communication. That is, the following various embodiments may be applied to the uplink communication.

Figure 2:
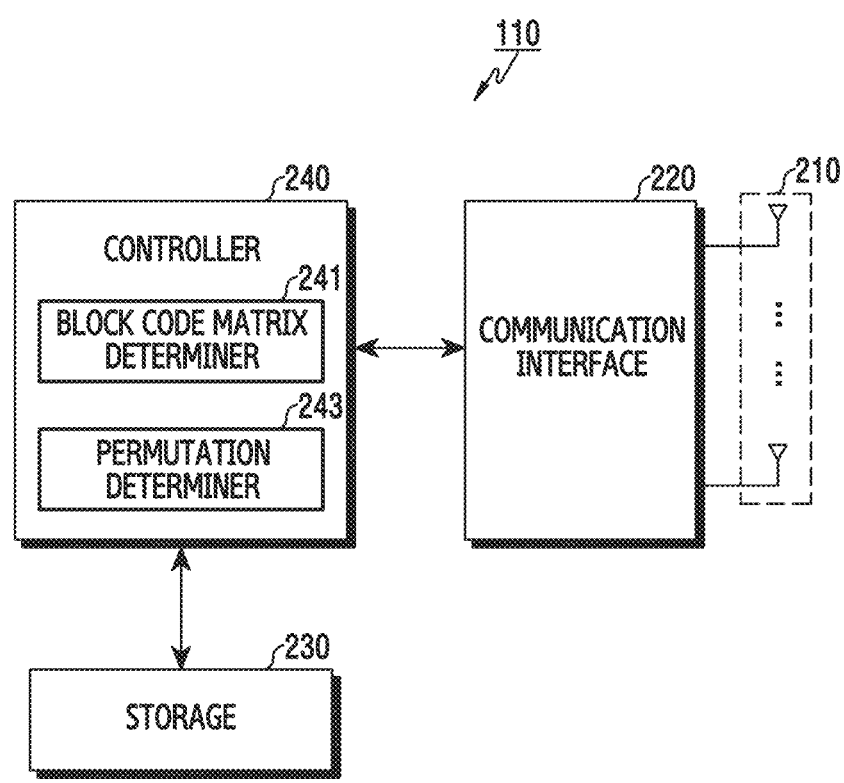
FIG. 2 illustrates a transmitting node in a wireless communication system according to various embodiments of the present disclosure.

FIG. 2 illustrates a transmitting node 110 in a wireless communication system according to various embodiments of the present disclosure. The term "~unit" or "~er" used hereinafter may refer to the unit for processing at least one function or operation and may be implemented in hardware, software, or a combination of hardware and software. Referring to FIG. 2, the transmitting node 110 may include an antenna unit 210, a communication interface 220, a storage 230, and a controller 240.

The antenna unit 210 is an element for radiating a radio frequency (RF) band signal to a radio channel or detecting a signal transmitted through a radio channel. The antenna unit 210 may include a plurality of antennas. For example, the antenna unit 210 may have a structure of a 2D (dimensional) antenna array. At this time, antenna elements included in the antenna unit 210 may have different polarities.

The communication interface 220 performs functions for transmitting and receiving a signal through a radio channel. For example, the communication interface 220 performs a function of conversion between a baseband signal and a bit stream according to a physical layer standard of the system. For example, when data is transmitted, the communication interface 220 generates complex symbols by encoding and modulating a transmission bit stream. Further, when data is received, the communication interface 220 reconstructs a reception bit stream by demodulating and decoding a baseband signal. In addition, the communication interface 220 up-converts a baseband signal into an RF band signal, transmits the converted signal through an antenna, and then down-converts the RF band signal received through the antenna into the baseband signal. For example, the communication interface 220 may include a transmission filter, a reception filter, an amplifier, a mixer, an oscillator, a digital to analog convertor (DAC), an analog to digital convertor (ADC), and the like.

The communication interface 220 may include a plurality of RF chains. Further, the communication interface 220 may map modulation symbols to a plurality of antennas through a block code scheme for transmit diversity and transmit the mapped modulation symbols. The block code scheme may include at least one of an SFBC scheme and an STBC scheme. The communication interface 220 may also perform beamforming. For beamforming, the communication interface 220 may control the phase and size of each of the signals transmitted and received through the plurality of antennas or the antenna elements, that is, perform analog beamforming. Alternatively, the communication interface 220 may perform beamforming for a digital signal, that is, perform digital beamforming.

The communication interface 220 may transmit and receive a signal as described above. Accordingly, the communication interface 220 may be referred to as a transmitter, a receiver, or a transceiver. Further, in the following description, transmission and reception performed through a radio channel are used as meanings including the processing by the communication interface 220 as described above.

The storage 230 stores a basic program, an application program, and data such as setting information for the operation of the transmitting node 110. The storage 230 may include a volatile memory, a non-volatile memory, or a combination of the volatile memory and the non-volatile memory. Further, the storage 230 provides stored data according to a request of the controller 240. That is, the storage 230 may store a pre-calculated permutation matrix to reduce a channel correlation by permutating a block code, and provide permutation matrix information according to a request of the controller 240.

The controller 240 controls general operations of the transmitting node 110. For example, the controller 240 transmits and receives a signal through the communication interface 220. Further, the controller 240 records data in the storage 230 and reads the data from the storage 230. To this end, the control unit 240 may include at least one processor. The controller 240 may determine whether to apply a block code scheme according to transmission modes of multiple users. According to another embodiment, when the transmission mode corresponds to a transmit diversity mode, the controller 240 may determine a block code matrix to be applied. The block code matrix may be one of the matrixes according to an SFBS or STBC scheme. Further, in order to reduce a channel correlation between a plurality of antennas for transmit diversity, the controller 240 may calculate a permutation matrix to permutate the block code matrix or select a pre-stored permutation matrix. To this end, the controller 240 may include a block code matrix determination unit 241 for determining a code scheme for signal processing (for example, block code for diversity transmission) and a permutation determination unit 243 for determining a permutation rule corresponding to the code scheme. Accordingly, the controller 240 may control the transmitting node 110 to perform a procedure according to various embodiments described below.

In the configuration of the transmitting node 110 described with reference to FIG. 2, the antenna unit 210 may be configured in various forms. For example, the antenna unit 210 may be configured as illustrated in FIGS. 3 and 4.

Figure 3:
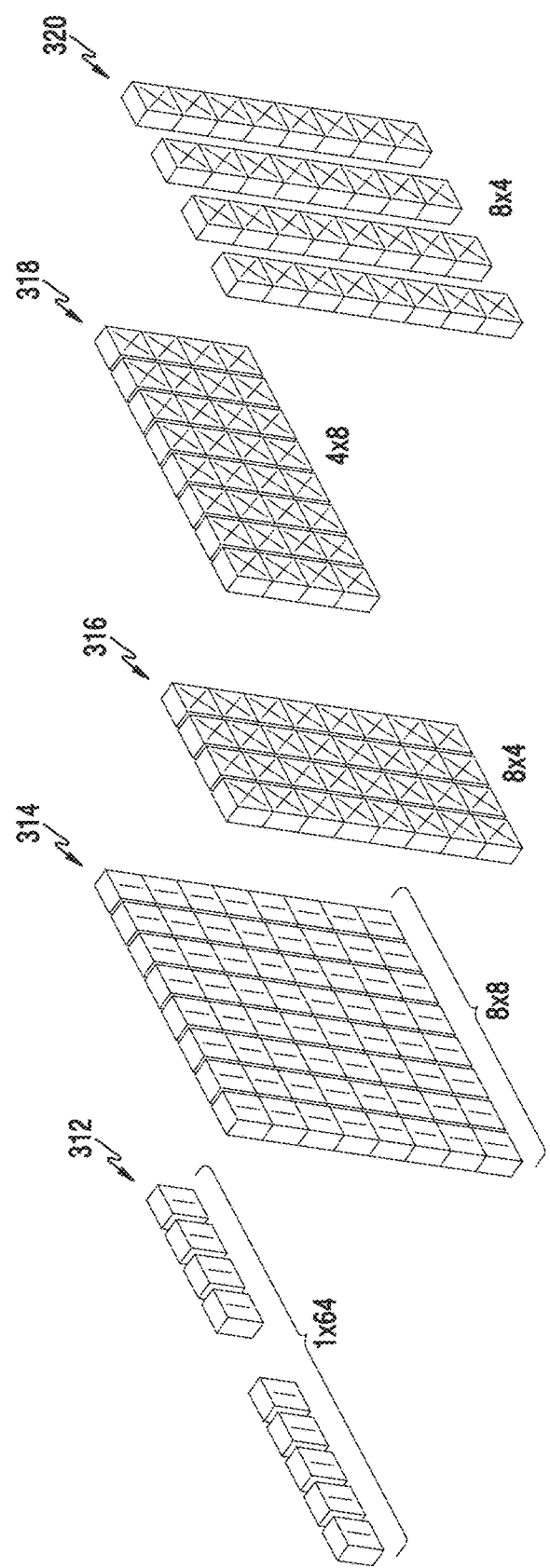
FIG. 3 illustrates various embodiments of a full dimensional multiple input multiple output (FD-MIMO) antenna in a wireless communication system according to various embodiments of the present disclosure.

FIG. 3 illustrates various examples of the FD-MIMO antenna according to various embodiments of the present disclosure. Referring to FIG. 3, the arrangement of a 2D antenna array for FD-MIMO may be one of the arrangements 312 to 320. The arrangement 312 corresponds to 1×64 antenna array arrangement, and may have a horizontal length of 4 m and a vertical length of 7 to 10 cm. The arrangement 314 corresponds to 8×8 antenna array arrangement, and may have a horizontal length of 0.5 m and a vertical length of 0.5 m. The arrangement 316 corresponds to 8×4 antenna array arrangement, and may have a horizontal length of 0.25 m and a vertical length of 0.5 m. The arrangement 318 corresponds to 4×8 antenna array arrangement, and may have a horizontal length of 0.5 m and a vertical length of 0.25 m. The arrangement 320 corresponds to the 8×4 antenna array arrangement that is the same as the arrangement 316, but may have a total horizontal length of 1 m with an interval between antenna columns in order to reduce a channel correlation. As illustrated in FIG. 3, a plurality of antennas is arranged in two dimensions for high-speed data transmission in the FD-MIMO system, so that a channel correlation problem between antennas is important to arrange the plurality of antennas in a limited space.

Figure 4:
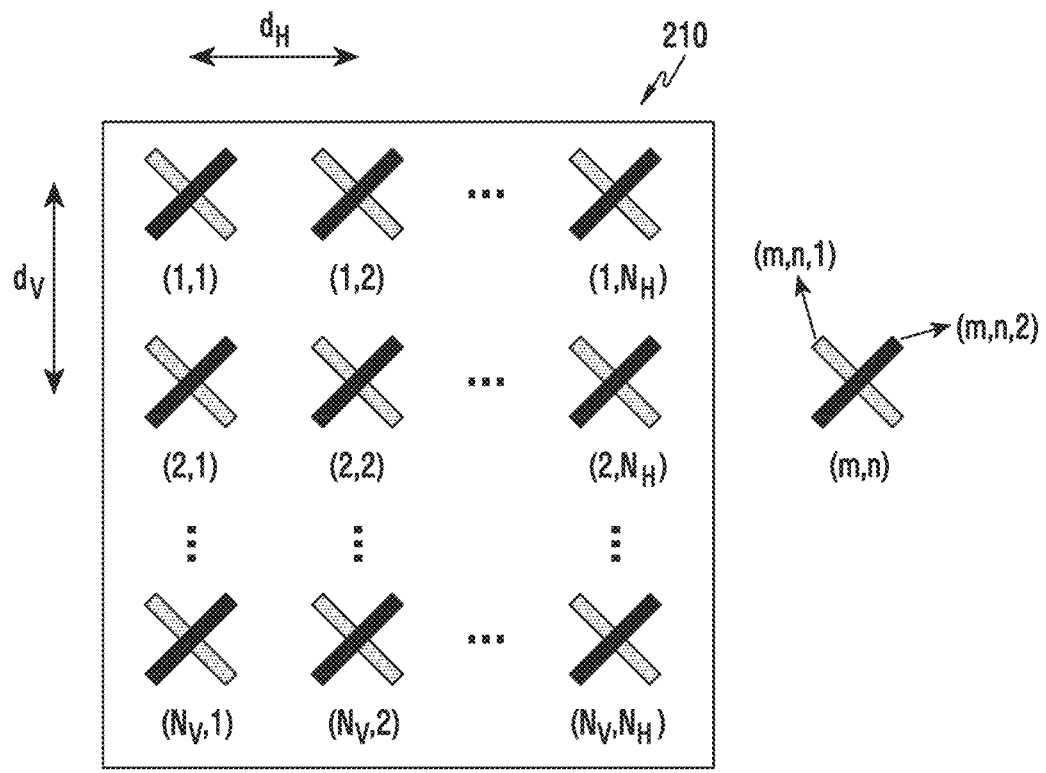
FIG. 4 illustrates an example of a 2 dimensional (2D) planar antenna array using cross-polarization antennas are used in a wireless communication system according to various embodiments of the present disclosure.

FIG. 4 illustrates an example of a 2D planar antenna array using cross-polarization antennas in a wireless communication system according to various embodiments of the present disclosure. Referring to FIG. 4, according to an embodiment, the antenna unit 210 may be a 2D planar antenna array that can accept maximum antennas in a limited space to allow the antennas to have different polarities by perpendicularly crossing two antennas at the same location. In FIG. 4, $N_V$ denotes the number of antennas included in the 2D planar antenna array, and $N_H$ denotes the number of columns of antennas included in the 2D planar antenna array. Further, $d_V$ denotes an interval between vertical antennas, and $d_H$ denotes an interval between horizontal antennas. Referring to FIG. 4, when antennas having two types of different polarities are arranged at the same location, an index of the antenna having a first polarity located at an $m^{th}$ row and an $n^{th}$ column may be expressed by (m, n, 1). An index of the antenna having a second polarity located at the $m^{th}$ row and the $n^{th}$ column may be expressed by (m, n, 2). In this case, a total number of antennas may be expressed by equation (1):

$$N_T = 2N_V N_H \qquad \text{Equation (1)}$$

where $N_T$ denotes a total number of transmission antennas, $N_V$ denotes the number of rows of antennas in the antenna array, and $N_H$ denotes the number of columns of antennas in the antenna array.

That is, when the polarities of the antennas are classified into two types as illustrated in FIG. 4, two antennas may be arranged at one location. The number of polarities of antennas may be two or more, and a maximum number of antennas included in the antenna array may be the product of the number of columns, the number of rows, and the number of polarities in the antenna array structure. According to another embodiment, antennas having three or more different polarities may be included in the antenna array.

Figure 5:
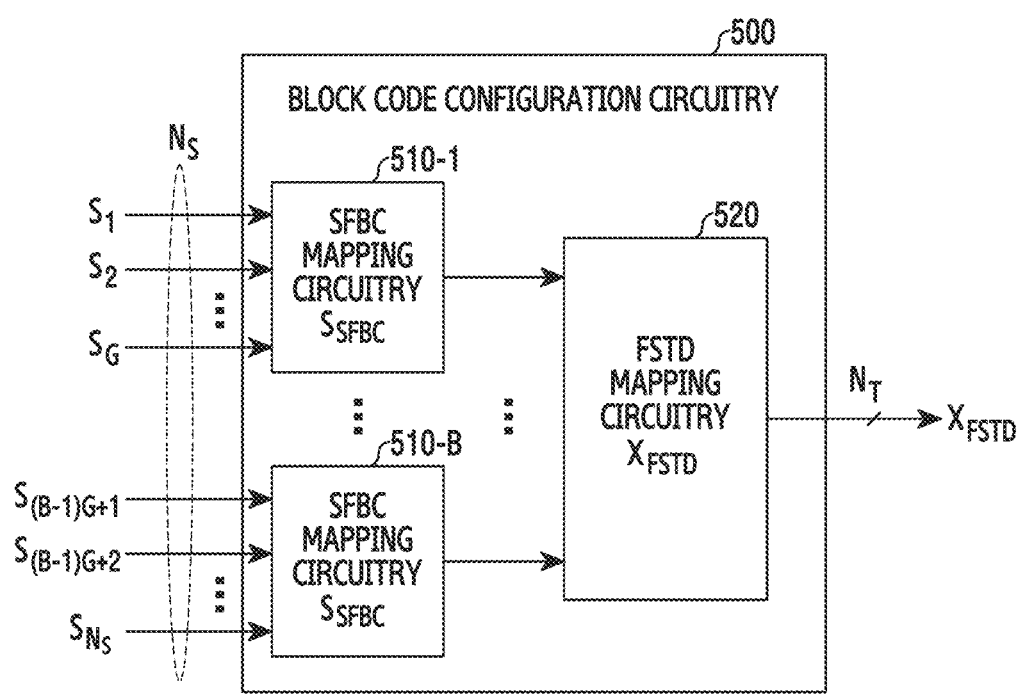
FIG. 5 illustrates a block code in a wireless communication system according to various embodiments of the present disclosure.

FIG. 5 illustrates an example of a block code configuration circuitry 500 for performing block coding in a wireless communication system according to various embodiments of the present disclosure. The block code configuration circuitry 500 may be an element of the communication interface 220 of FIG. 2 and may be differently configured according to a block code scheme to be applied. Referring to FIG. 5, according to an embodiment, the block code configuration circuitry 500 applying a FSTD scheme includes SFBC mapping circuitry 510-1 to 510-B and an FSTD mapping circuitry 520 for combining SFBC blocks.

The FSTD scheme corresponds to a scheme for orthogonally stacking SFBC matrixes such as Alamouti code effectively operating in a small number of antennas on a frequency domain. In FIG. 5, $N_S$ denotes the number of data symbols, $N_T$ denotes the number of transmission antennas, B denotes the number of SFBC blocks, and $S_i$ denotes an $i^{th}$ data symbol.

According to an embodiment, the block code configuration circuitry 500 receives $N_S$ data symbols, and blocks the data symbols for each antenna and frequency so as to generate SFBC block codes. That is, $N_S$ symbols are joined together into G data symbols to be transmitted to the same time-frequency resources. Accordingly, B data symbol groups are generated, and the SFBC mapping circuitry 510-1 to 510-B block-code respective symbols of each of the B groups for transmit diversity. As a result, when an $l^{th}$ SFBC block is generated from the G data symbols, the $l^{th}$ SFBC block may be expressed by. $S_{SFBC}(\{S_i\}_{i=(l-1)G}^{lG})$ The FSTD mapping circuitry 520 configures an $X_{FSTD}$ matrix by orthogonally stacking the SFBC blocks generated by the SFBC mapping circuitry 510-1 to 510-B on the frequency domain. The $X_{FSTD}$ matrix corresponds to a code block corresponding to a permutation matrix, and each of the B SFBC blocks becomes a sub-block included in the $X_{FSTD}$ matrix. That is, the FSTD mapping matrix in which the B SFBC blocks are arranged in an FSTD scheme may be expressed by Equation (2):

$$X_{FSTD}(\{s_i\}_{i=1}^{N_S}) = blkdiag \underbrace{\left\{S_{SFBC}(\{s_i\}_{i=1}^{G}), \ldots, S_{SFBC}(\underbrace{\{s_i\}_{i=(l-1)G+1}^{lG}}_{G\ symbols}), \ldots, S_{SFBC}(\{s_i\}_{i=(B-1)G+1}^{N_S})\right\}}_{B\ SFBCs} \quad \text{Equation (2)}$$

where $X_{FSTD}(\{S_i\}_{i=1}^{N_S})$ denotes an FSTD mapping matrix, $S_i$ denotes an $i^{th}$ data symbol, $N_S$ denotes a total number of data symbols, blk diag{ } denotes a block diagonal matrix, $S_{SFBC}(\{Si\}_{i=(l-1)G}^{lG})$ denotes an $l^{th}$ SFBC block, G denotes the number of symbols applied to one SFBC mapping circuitry (that is, the number of symbols to be coded into one block), and B denotes the number of SFBC blocks generated when data symbols are divided by G and encoded.

For example, in an FSTD with Alamouti (FSTD-A) scheme using Alamouti code, when G=2 and $N_S$=4, the number of SFBC blocks becomes B=2. Four data symbols $S_1$, $S_2$, $S_3$, and $S_4$ are mapped to $S_A(S_1, S_2)$ and $S_A(S_3, S_4)$ through the SFBC mapping circuitry 510-1 and 510-2, and mapped to $X_{FSTD-A}(\{S_i\}_{i=1}^{4})$ as shown in Equation (3) via the FSTD mapping circuitry 520.

$$X_{FSTD-A}(\{S_i\}_{i=1}^4) = blkdiag\{S_A(S_1,S_2), S_A(S_3,S_4)\} = \begin{bmatrix} \overbrace{\begin{matrix} s_1 & -s_2^* \\ s_2 & s_1^* \end{matrix}}^{S_A(s_1,s_2)} & 0 & 0 \\ 0 & 0 & \underbrace{\begin{matrix} s_3 & -s_4^* \\ s_4 & s_3^* \end{matrix}}_{S_A(s_3,s_4)} \end{bmatrix} \quad \text{Equation (3)}$$

where $X_{FSTD-A}(\{S_i\}_{i=1}^{4})$ denotes an FSTD matrix in which SFBC blocks are orthogonally arranged, $S_i$ denotes an $i^{th}$ data symbol, $S_i^*$ denotes a conjugate complex symbol of $i^{th}$ data, blk diag{ } denotes a block diagonal matrix, and $S_A(S_1, S_2)$ and $S_A(S_3, S_4)$ denote SFBC blocks. In Equation (3), a column of the matrix corresponds to each subcarrier (frequency) and a row corresponds to each antenna. $S_A$ blocks are sub-blocks included in $X_{FSTD-A}$ to which a permutation operation described below is applied.

In another example, in an FSTD with Phase Shift Diversity (FSTD-PSD) scheme, when G=2, $N_S$=4, and $N_T$=8, an FSTD-PSD mapping matrix $X_{FSTD}(\{S_i\}_{i=1}^{N_S})$ may be expressed by Equation (4). Since G=2, symbols to share the same time-frequency resources may be grouped by two such as $(S_1, S_2)$ and $(S_3, S_4)$, but the number $N_T$ of transmission antennas is larger than the number $N_S$ of input symbols, so that the symbols may be block-coded including phase shifted symbols as shown in Equation (4). That is, four data symbols $S_1$, $S_2$, $S_3$, and $S_4$ are mapped to $S_{PSD}(S_1, S_2)$ and $S_{PSD}(S_3, S_4)$ through the SFBC mapping circuitry 510-1 and 510-2, and mapped as shown in Equation (4) via the FSTD mapping circuitry 520:

$$X_{FSTD-PSD}(\{S_i\}_{i=1}^4) = blkdiag\{S_{PSD}(S_1, S_2), S_{PSD}(S_3, S_4)\} = \quad \text{Equation (4)}$$

$$\begin{bmatrix} \overbrace{\begin{matrix} s_1 & -s_2^* \\ s_2 & s_1^* \\ s_1 e^{j\theta_1 k} & -s_2^* e^{j\theta_1 k} \\ s_2 e^{j\theta_2 k} & s_1^* e^{j\theta_2 k} \end{matrix}}^{S_{PSD}(s_1,s_2)} & \begin{matrix} 0 & 0 \\ 0 & 0 \\ 0 & 0 \\ 0 & 0 \end{matrix} \\ \begin{matrix} 0 & 0 \\ 0 & 0 \\ 0 & 0 \\ 0 & 0 \end{matrix} & \underbrace{\begin{matrix} s_3 & -s_4^* \\ s_4 & s_3^* \\ s_3 e^{j\theta_3 k} & -s_4^* e^{j\theta_3 k} \\ s_4 e^{j\theta_4 k} & s_3^* e^{j\theta_4 k} \end{matrix}}_{S_{PSD}(s_3,s_4)} \end{bmatrix}$$

where $X_{FSTD-PSD}(\{S_i\}_{i=1}^{4})$ denotes an FSTD-PSD mapping matrix, $S_i$ denotes an $i^{th}$ data symbol, blk diag{ } denotes a block diagonal matrix, $S_{PSD}(S_1, S_2)$ and $S_{PSD}(S_3, S_4)$ denote PSD blocks, and $\theta_1$, $\theta_2$, $\theta_3$, $\theta_4$ denote phase shift values. In Equation (4), a column of the matrix corresponds to each subcarrier (frequency) and a row corresponds to each antenna. $S_{PSD}$ blocks are sub-blocks included in $X_{FSTD-PSD}$ to which a permutation operation described below is applied. As a result, $N_S$ data symbols may be block-coded via the block code configuration circuitry 500 and mapped to $N_S$ transmission antennas.

The above-described FSTD scheme is very easily implemented and thus is used in many fields such as an LTE system and a cognitive radio standard. However, the present disclosure is not limited to the FSTD scheme, and different block codes may be used according to various embodiments.

According to various embodiments, in addition to the block coding as illustrated in FIG. 5, a permutation may be performed. In various embodiments, the permutation is performed to reduce a correlation between channels for transferring signals by controlling a mapping relation between block-coded signals and antennas. In this case, signal transmission may be performed as illustrated in FIG. 6.

Figure 6:
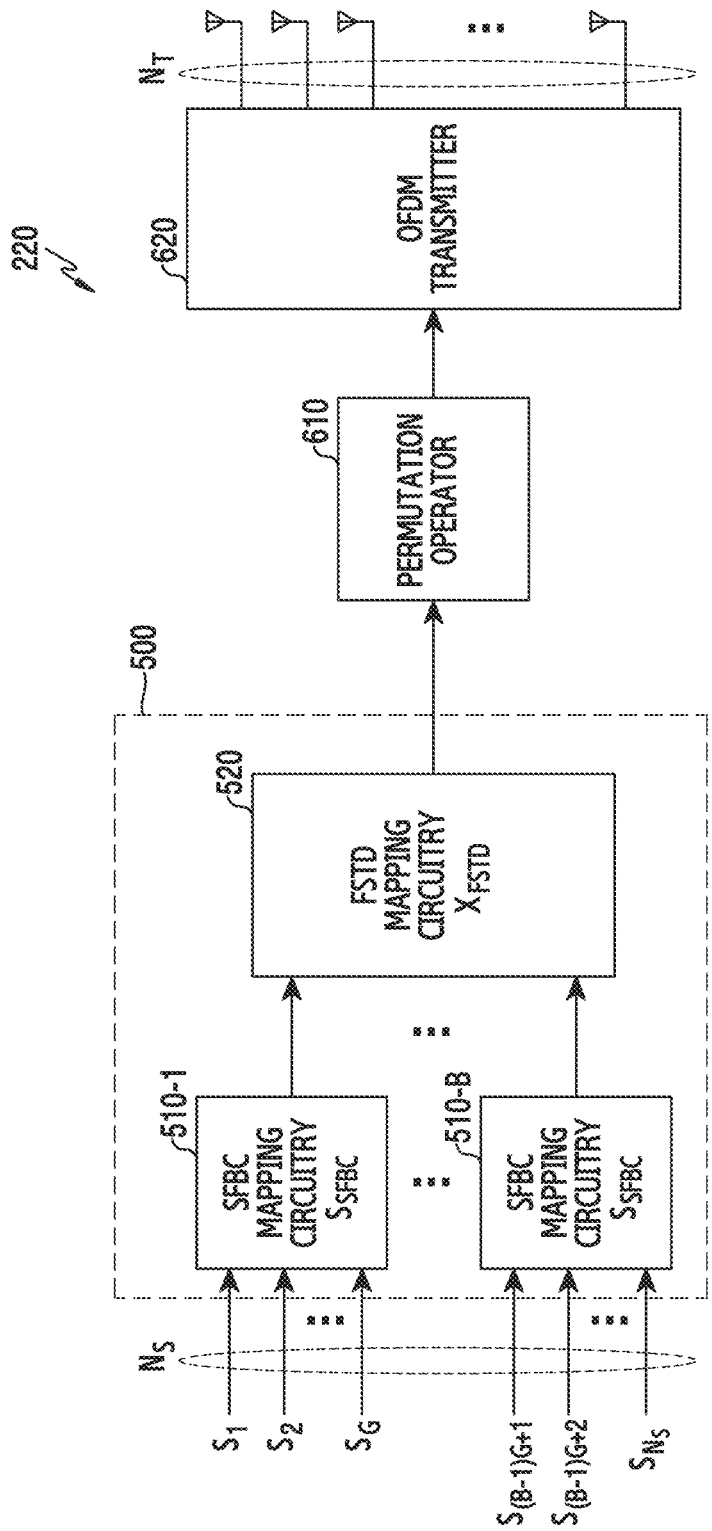
FIG. 6 illustrates a transmission of a signal in a wireless communication system according to various embodiments of the present disclosure.

FIG. 6 illustrates a transmission of a signal in a wireless communication system according to various embodiments of the present disclosure. According to an embodiment, elements illustrated in FIG. 6 may be some elements of the communication interface 220 of the transmitting node 110.

Referring to FIG. 6, according to an embodiment, the communication interface 220 includes the block code configuration circuitry 500, a permutation operator 610, and an OFDM transmitter 620. The block code configuration circuitry 500 may include the SFBC mapping circuitry 510-1 to 510-B and the FSTD mapping circuitry 520 for combining the SFBC blocks.

$N_S$ data symbols are block-coded via the SFBC mapping circuitry 510-1 to 510-B of the block code configuration circuitry 500 and the FSTD mapping circuitry 520 for combining the SFBC matrixes and then input into the permutation operator 610. The permutation operator 610 multiplies an input FSTD matrix $X_{FSTD}(\{S_i\}_{i=1}^{N_S})$ and a permutation matrix Π in order to additionally improve error performance. At this time, $N_T$ rows in $X_{FSTD}(\{S_i\}_{i=1}^{N_S})$ are mixed by the matrix Π in consideration of a channel correlation between antennas. Data symbols mixed by the matrix Π are transmitted by the OFDM transmitter 620 through $N_T$ antennas. For example, when $N_S$=4 and G=2 in the FSTD-A scheme, the data symbols mixed by the matrix Π may be expressed by Equation (5):

$$\begin{bmatrix} \boxed{\begin{matrix} s_1 & -s_2^* \\ s_2 & s_1^* \end{matrix}} & \begin{matrix} 0 & 0 \\ 0 & 0 \end{matrix} \\ \begin{matrix} 0 & 0 \\ 0 & 0 \end{matrix} & \boxed{\begin{matrix} s_3 & -s_4^* \\ s_4 & s_3^* \end{matrix}} \end{bmatrix} \xrightarrow{\text{permute } \Pi} \begin{bmatrix} \boxed{\begin{matrix} s_1 & -s_2^* \end{matrix}} & \begin{matrix} 0 & 0 \\ \end{matrix} \\ \begin{matrix} 0 & 0 \end{matrix} & \boxed{\begin{matrix} s_3 & -s_4^* \end{matrix}} \\ \boxed{\begin{matrix} s_2 & -s_1^* \end{matrix}} & \begin{matrix} 0 & 0 \end{matrix} \\ \begin{matrix} 0 & 0 \end{matrix} & \boxed{\begin{matrix} s_4 & s_3^* \end{matrix}} \end{bmatrix}$$

1-st SFBC / 2-nd SFBC

Equation (5)

where $S_i$ denotes an $i^{th}$ data symbol, an upper left block denotes a first SFBC block and a lower right block denotes a second SFBC block. The first SFBC block and the second SFBC block are sub-blocks within the code block corresponding to the permutation matrix. In Equation (5), a column of the matrix corresponds to each subcarrier (e.g., frequency) and a row corresponds to each antenna. Referring to Equation (5), after the permutation operation, antenna mapping for symbols within the first SFBC block and the second SFBC block may become different.

A process of calculating and applying the matrix Π according to various embodiments will be described in detail through FIGS. 8 to 12 below.

In the above-described embodiments, Alamouti has been used as an example of the SFBC. However, according to various embodiments, the scheme proposed by the present disclosure may be applied to another SFBC operating in $2^n$ (2, 4, 8, . . . ) antennas. For example, code matrix schemes such as Jafarkhani (H. Jafarkhani, "A quasi-orthogonal space-time block code," IEEE TCOM, 2001), Tirkkonen-Hottinen (O. Tirkkonen et. al., "Square-matrix embeddable space-time block codes for complex signal constellations," IEEE TIT, 2002), Trikkonen-Boariu-Hottinen (O. Tirkkonen et. al., "Minimal nonorthogonality rate 1 space-time block code for 3+Tx antennas," IEEE ISSSTA, 2000), Su-Xia (W. Su et. al., "Signal constellations for quasi-orthogonal space-time block codes with full diversity," IEEE TIT, 2004), Tarokh-Jafarkhani-Calderbank 1 (V. Tarokh et. al., "Space-time block codes from orthogonal designs," IEEE TIT, 1999), Tarokh-Jafarkhani-Calderbank 2 (V. Tarokh et. al., "Space-time block codes from orthogonal designs," IEEE TIT, 1999), Kim (J. Kim et. al., "STBC/SFBC for 4 transmit antennas with 1-bit feedback," IEEE ICC, 2008), Murthy-Gowri (N. S. Murthya et. al., "Full rate general complex orthogonal space-time block code for 8-transmit antenna," IWIEE, 2012), Erotokritou (I. D. Erotokritou, "Space-time block coding for multiple transmit antennas over time-selective fading channels" Louisiana State University, May, 2006), Tran-Seberry-Wang-Wysocki (L. C. Tran et. al., "Two new complex orthogonal space time codes for 8 transmit antennas," University of Wollongong, 2004) as well as Alamouti may be applied.

Further, in the above-described embodiments, the FSTD of the scheme for orthogonally arranging the SFBC blocks on the frequency domain has been described. However, according to another embodiment, a scheme such as time switched transmit diversity (TSTD) for the STBC may be applied. According to various embodiments, an independent block code that is not based on the SFBC or the STBC may be used. In other words, the permutation according to various embodiments may be applied to an independently defined block code, not the code defined by a combination of different block codes such as the FSTD and the TSTD. However, similar to the FSTD, it is preferable that the block code to which the permutation according to various embodiments can be applied has a characteristic in which at least one antenna is not used in the same time-frequency resources.

Figure 7:
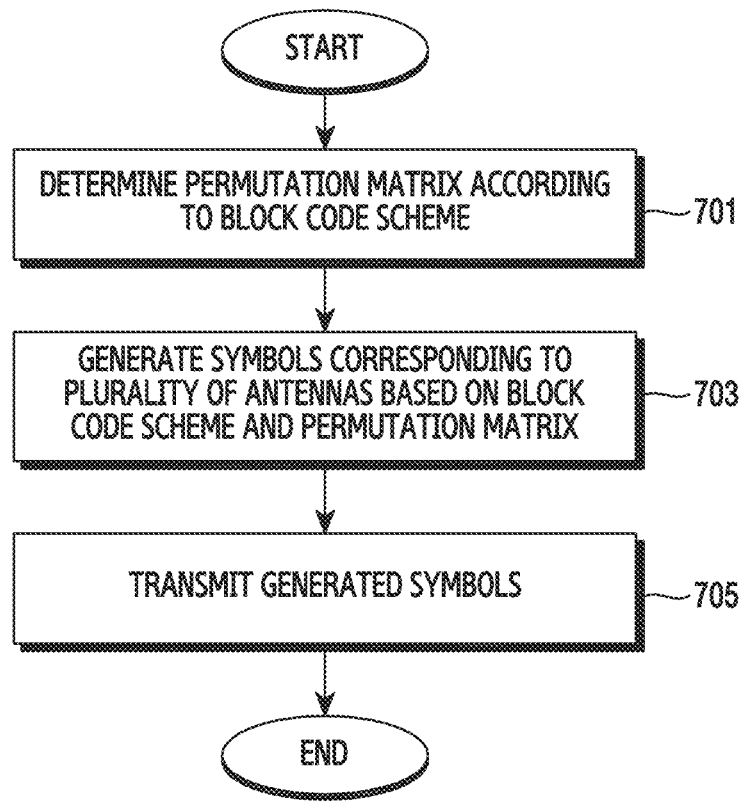
FIG. 7 illustrates a process of transmitting signals through a plurality of antennas based on a permutation matrix in a wireless communication system according to various embodiments of the present disclosure.

FIG. 7 illustrates a process of transmitting signals through a plurality of antennas based on a permutation matrix in a wireless communication system according to various embodiments of the present disclosure. A transmitting node described in FIG. 7 may be the transmitting node 110 illustrated in FIG. 2.

Referring to FIG. 7, in step 701, the transmitting node determines a permutation matrix according to a block code scheme. According to an embodiment, the block code scheme may be determined according to a transmission mode for a user. Data symbols are coded to be mapped to a plurality of antennas by the block code scheme, and at this time, at least one of the plurality of antennas is not mapped to the symbol in one time-frequency resource. In other words, the block code scheme may have a characteristic in which some antennas are not used in the same time-frequency resources. For example, the block code scheme may belong to one range of the SFBC and the STBC. Specifically, the block code scheme may be an FSTD scheme or a TSTD scheme in which SFBC blocks or STBC blocks are orthogonally arranged. Particularly, the FSTD scheme may be one of FSTD-A, FSTD-PSD, and FSTD with extended PSD (FSTD-E-PSD). Specifically, the transmitting node may select a permutation matrix according to the number of sub-blocks within a code block corresponding to one permutation matrix and an arrangement structure (for example, the number of rows and the number of columns) of antennas as described below. For example, the transmitting node may search for at least one permutation matrix corresponding to the number of sub-blocks and the arrangement structure of antennas in a codebook including a plurality of predefined permutation matrixes.

In step 703, the transmitting node generates symbols corresponding to a plurality of antennas based on the block code scheme and the permutation matrix. In other words, the transmitting node block-codes data symbols according to the block code scheme and mix the block-coded symbols according to the permutation matrix. According to an embodiment, the transmitting node may map the data symbols to the plurality of antennas by multiplying the block code matrix and the permutation matrix. For example, the transmitting node may generate symbols corresponding to the plurality of antennas by multiplying the FSTD matrix described in FIG. 6 and the permutation matrix.

In step 705, the transmitting node transmits the generated symbols based on the block code scheme and the permutation matrix. In other words, through the antennas, the transmitting node may transmit the symbols mixed through the permutation matrix. At this time, additional signal processing may be performed according to a physical layer transmission scheme. For example, the transmitting node may map the symbols mixed through the permutation matrix to time-frequency resources, perform OFDM modulation, and then transmit OFDM symbols. According to another embodiment, the OFDM scheme may be replaced with an FBMC scheme.

As described above, according to various embodiments, the permutation for the block code may be performed. That is, the permutation may be performed to reduce the channel correlation between antennas within a sub-block including symbols of one group that share the same time-frequency resources in an open-loop environment in which there is no feedback of channel information. Causes of the channel correlation in the FD-MIMO system are two types largely including a space channel correlation and a polarity channel correlation. The space channel correlation corresponds to a phenomenon occurring between antenna elements arranged close to each other, and may be reduced as a distance between the antenna elements increases. Further, the polarity channel correlation may be reduced as antennas having different polarities are used. Accordingly, the process of calculating the permutation matrix proposed by the present disclosure may include a space separation step and a polarity separation step between antennas within a sub-block including one group of symbols that share the same time-frequency resources. The space separation step corresponds to a step of finding a combination of antennas of which a minimum distance is maximum within the sub-block in order to reduce the channel correlation between antennas. The polarity separation step corresponds to a step of configuring antennas having a minimum distance to have opposite polarities in the combination of antennas acquired through the space separate step. The permutation matrix according to various embodiments based on the space separate and the polarity separation may be determined as follows.

Figure 8A:
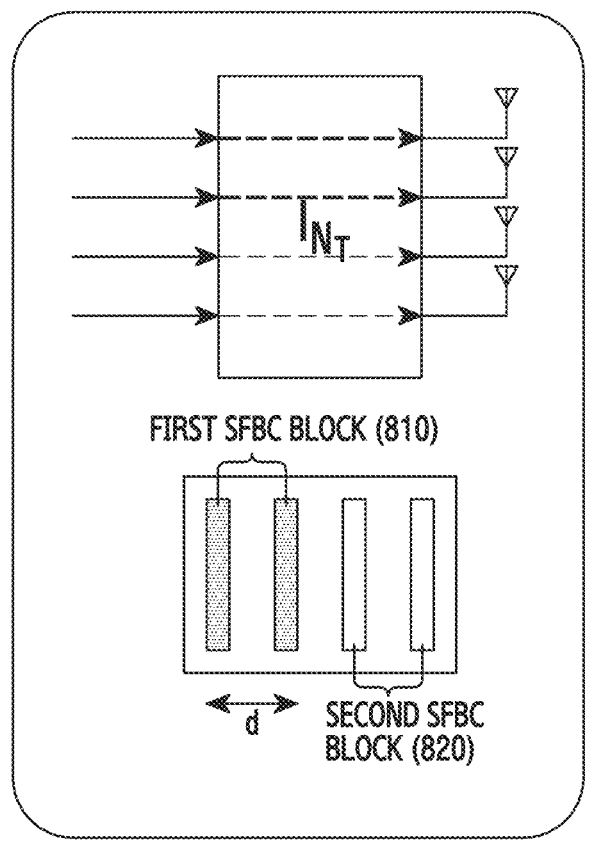
FIG. 8A illustrates an example of signal transmission when the permutation matrix is not applied in a wireless communication system according to various embodiments of the present disclosure.
Figure 8B:
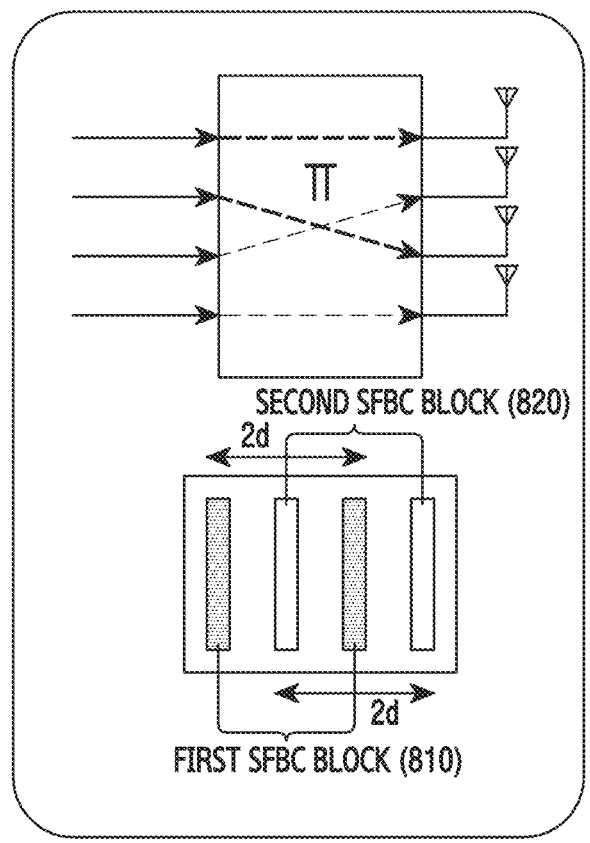
FIG. 8B illustrates an example of signal transmission when the permutation matrix is applied when the permutation matrix is applied in a wireless communication system according to various embodiments of the present disclosure.

FIGS. 8A and 8B illustrate cases where the permutation matrix is not applied and is applied for comparison according to various embodiments of the present disclosure. Hereinafter, FIGS. 8A and 8B illustrate a block code scheme based on an SFBC. However, according to various embodiments, the permutation may be performed when a different block code scheme is used.

FIG. 8A illustrates an example of signal transmission when the permutation matrix is not applied in a wireless communication system according to various embodiments of the present disclosure. Referring to FIG. 8A, according to an embodiment, the transmitting node transmits SFBC-coded symbols. According to an embodiment, when the number B of SFBC blocks is 2, a first SFBC block 810 and a second SFBC block 820 are transmitted through four antennas. Specifically, the first SFBC block 810 is transmitted through a first time-frequency resource and the second SFBC block 820 is transmitted through a second time-frequency resource. At this time, when the permutation is not performed, a minimum distance between first and second antennas used for transmitting the first SFBC block 810 is d and a minimum distance between third and fourth antennas used for transmitting the second SFBC block 820 is also d.

FIG. 8B illustrates an example of signal transmission when the permutation matrix is applied when the permutation matrix is applied in a wireless communication system according to various embodiments of the present disclosure. Referring to FIG. 8B, the first SFBC block 810 and the second SFBC block 820 are mixed through the permutation. That is, unlike FIG. 8A, the first SFBC block 810 is transmitted through first and third antennas and the second SFBC block 820 is transmitted through second and fourth antennas. Accordingly, when the signals mixed according to the permutation matrix are transmitted through four antennas, a minimum distance between antennas used for transmitting the first SFBC block 810 and the second SFBC block 820 increases to be 2d.

As illustrated in FIGS. 8A and 8B, when the permutation matrix proposed in the present disclosure is used, there may be an effect of reducing a spatial channel correlation between antennas as the minimum distance between antennas used for the same time-frequency resources increases.

As described above, a spatial channel correlation problem may be solved by maximizing a minimum distance between antenna elements within a block using the same time-frequency resources. According to an embodiment, in a 2D antenna array using cross-polarization antennas, a set $A_l$ for maximizing a minimum distance between antenna elements may be expressed by Equation (6):

$$\underset{\{A_l\}}{\text{maximize}} \ \underset{l}{\min} \ d_{min,i} \qquad \text{Equation (6)}$$

$$\text{s.t.} \ |A_l| = N_T/B, \ \forall \ l = 1, \ldots, B/2$$

$$A_l \cap A_k = \emptyset, \ \forall \ l \neq k,$$

where $A_l$ denotes a set of locations (m, n) of antenna elements for transmitting $l^{th}$ and $l+B/2^{th}$ SFBC blocks, an objective function $d_{min,l}$ denotes a minimum distance between locations of two antennas belonging to the set $A_l$, $N_T$ denotes a total number of antennas, and B denotes the number of SFBC blocks. Since the cross-polarization antennas are used, one antenna element location set $A_l$ is determined for two SFBC blocks. However, the location set $A_l$ may be a combination of a different pair other than a pair of $l^{th}$ and $l+B/2^{th}$ SFBC blocks. When antennas having three or more types of polarities are installed at one antenna location, SFBC blocks sharing one location set $A_l$ may increase to be the number of polarities.

Figure 9:
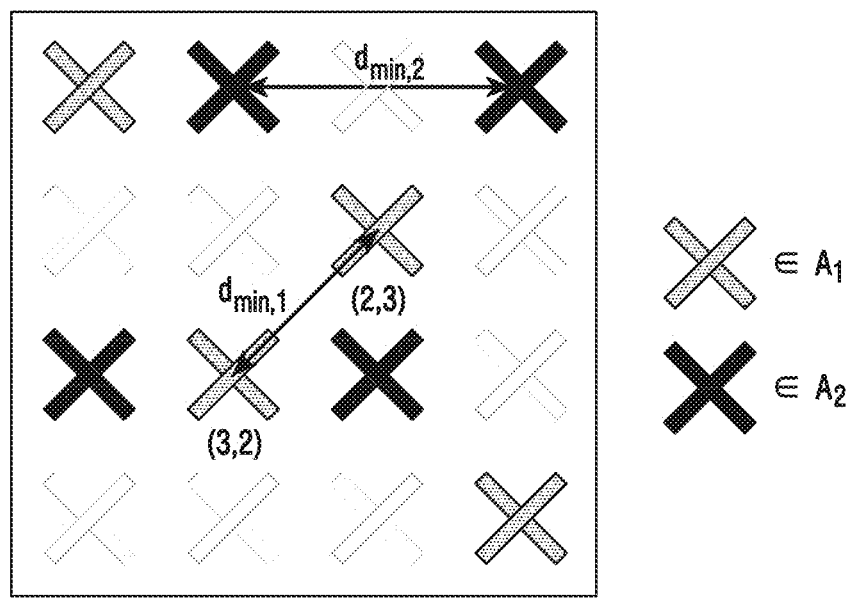
FIG. 9 illustrates an example of an optimization parameter for space separation in a wireless communication system according to various embodiments of the present disclosure.

FIG. 9 illustrates an example of an optimization parameter for space separation in a wireless communication system according to various embodiments of the present disclosure. Referring to FIG. 9, $A_l$ includes a set $A_1$ of antenna locations for transmitting a first block code and a set $A_2$ of antenna locations for transmitting a second block code. At this time, minimum distances $d_{min,1}$ and $d_{min,2}$ between antennas in respective sets are parameters to be optimized, which are objective functions. The objective function $d_{min,l}$ may be defined as Equation (7):

$$d_{min,l} = \underset{\substack{(i,j),(m,n) \in A_l \\ (i,j) \neq (m,n)}}{\min} \sqrt{(m-i)^2 d_V^2 + (n-j)^2 d_H^2} \ . \qquad \text{Equation (7)}$$

where $d_{min,l}$ denotes an objective function, $d_V$ denotes a horizontal distance between antennas, and $d_H$ denotes a vertical distance between antennas.

Equation (6) aims at maximizing a minimum value of the objective function $d_{min,l}$ in order to minimize the spatial channel correlation. For example, referring to FIG. 9, a minimum distance between antenna locations of $A_1$ is $d_{min,1}$ corresponding to a diagonal distance between a location of (2, 3) and a location of (3, 2). A minimum distance between antenna locations of $A_2$ is $d_{min,2}$ corresponding to a horizontal distance between two antenna locations as illustrated in FIG. 9. In this case, when $d_{min,1}$ is smaller than $d_{min,2}$, Equation (6) aims at finding the value that makes the minimum value $d_{min,1}$ of $d_{min,l}$ maximum. In order to find the final value, an exhaustive search scheme for calculating objective functions for all available candidates $A_l$ may be applied, so that a search size of Equation (6) is $$\sum_{n=1}^{B/2} \binom{\frac{nN_T}{B}}{\frac{N_T}{B}}.$$

Accordingly, antenna sets that make the minimum distance between antennas maximum may be determined by inspecting a search space having the search size of $$\sum_{n=1}^{B/2} \binom{\frac{nN_T}{B}}{\frac{N_T}{B}}$$

according to an embodiment. Additionally, the present disclosure provides another embodiment below to reduce the search size.

By re-configuring Equation (6) with a new parameter D, an optimization condition is expressed as Equation (8) given by:

$$\begin{aligned}&\underset{\{A_l\},D}{\text{maximize}}\, D \\ &\text{s.t. } d_{\min,l} = D,\, \forall\, l = 1, \ldots, B/2 \\ &|A_l| = N_T/B,\, \forall\, l = 1, \ldots, B/2, \\ &A_l \cap A_k = \emptyset,\, \forall\, l \ne k\end{aligned} \quad \text{Equation (8)}$$

where $N_T$ denotes a total number of antennas, B denotes the number of SFBC blocks, $A_l$ denotes a set of locations (m, n) of antenna elements for transmitting $l^{th}$ and $l+B/2^{th}$ SFBC blocks, and D denotes a minimum distance between antennas in all sets of $A_l$. To resolve Equation (8), a maximum value of D that satisfies the condition of the problem may be found through two steps of determining the set $A_l$ that satisfies $d_{\min,l}=D$ and optimizing D based on the set $A_l$. Accordingly, based on Equation (8), the antenna sets that make the minimum distance between antennas maximum may be determined by inspecting the search space having the search size smaller than that of Equation (6) according to an embodiment. Additionally, the present disclosure provides another embodiment below to reduce the search size.

Figure 10:
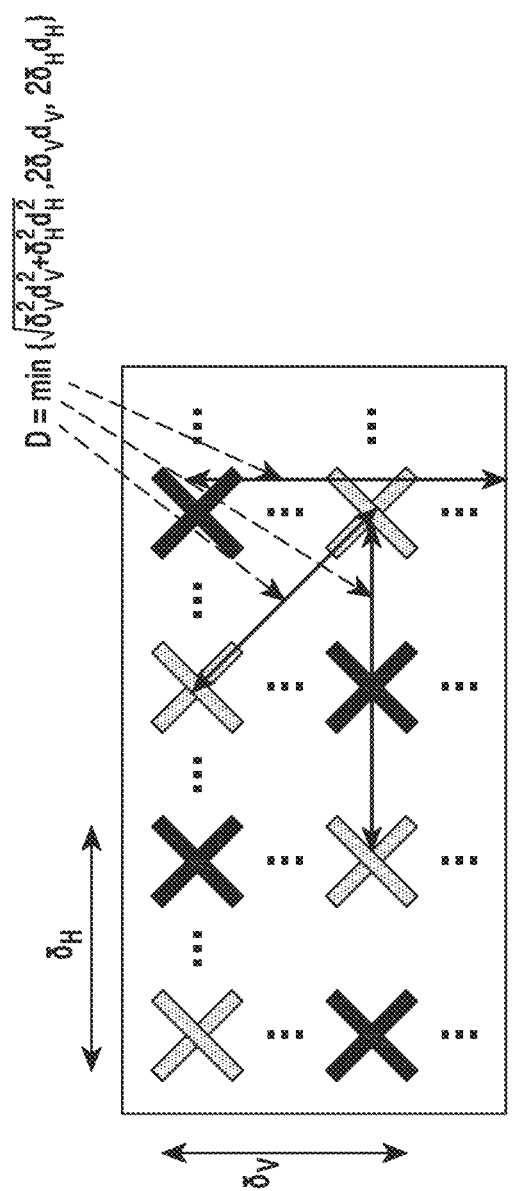
FIG. 10 illustrates an example of an antenna set pattern for space separation in a wireless communication system according to various embodiments of the present disclosure.

FIG. 10 illustrates an antenna set pattern for space separation in a wireless communication system according to various embodiments of the present disclosure. Referring to FIG. 10, the present disclosure proposes one predefined pattern that may simplify a search parameter as a heuristic scheme for determining a set that makes a minimum distance between antennas maximum. According to an embodiment, a zigzag pattern that may reduce a search size while maximizing a minimum distance between antennas is proposed. That is, the zigzag pattern refers to a pattern determined by searching for an antenna location through a method of, when a next antenna location is searched for from a start position, finding an antenna location in a diagonal direction in which antennas are not located at the same row or column. A column index difference and a row index difference between an antenna location and the next antenna location found in the diagonal direction may be the same as or different from each other. When a plurality of antenna rows and a plurality of antenna columns exist, the zigzag pattern may have a grid structure that is repeated every predetermined number of rows or columns. According to another embodiment, the method of determining a set of antennas may include other methods as well as the zigzag pattern.

In order to simplify the problem, the present disclosure introduces new parameters $\delta_V$ and $\delta_H$ in a first step for finding a set $A_l$ that satisfies $d_{\min,l}=D$. $\delta_V$ refers to a vertical distance between two antennas, and $\delta_H$ refers to a horizontal distance between two antennas. The vertical distance or the horizontal distance may be expressed by the number of antennas located between two antennas. Through a heuristic scheme based on newly introduced parameters, the set $A_l$ of locations (m, n) of antenna elements that transmit $l^{th}$ and $l+B/2^{th}$ SFBC blocks may be configured as Equation (9) given by:

$$A_l = \begin{cases} \left\{ \begin{array}{l} ((m-1)\delta_V + i_l,\, (2n-1-\text{mod}(m,2))\delta_H + j_l) \\ \left| 1 \le m \le \frac{N_V}{\delta_V} \text{ and } 1 \le n \le \frac{N_H}{2\delta_H} \right. \end{array} \right\}, & \text{for } l = 1, \ldots, \frac{B}{4} \\[2ex] \left\{ \begin{array}{l} ((m-1)\delta_V + i_{l-\frac{B}{4}},\, (2n-1-\text{mod}(m+1,2))\delta_H + j_{l-\frac{B}{4}}) \\ \left| 1 \le m \le \frac{N_V}{\delta_V} \text{ and } 1 \le n \le \frac{N_H}{2\delta_H} \right. \end{array} \right\}, & \text{for } l = \frac{B}{4}+1, \ldots, \frac{B}{2} \end{cases}$$

Equation (9)

where $A_l$ denotes a location set, $\delta_V$ denotes a vertical distance between two antennas, $\delta_H$ denotes a horizontal distance between two antennas, B denotes the number of sub-blocks, $i_l \triangleq [l/\delta_H]$ is defined, and $j_l \triangleq \text{mod}(l-1, \delta_H)+1$ is defined.

At this time, the minimum distance D is expressed as Equation (10). According to a repeated pattern, the minimum distance D may be determined as a minimum value among $\sqrt{\delta_V^2 d_V^2 + \delta_H^2 d_H^2}$ based on a diagonal distance between antennas, $2\delta_V d_V$ based on a vertical distance between antennas, and $2\delta_H d_H$ based on a horizontal distance between antennas. That is, the search size of the objective function D may be reduced by using a repeated grid structure pattern:

$$D = \min\{\sqrt{\delta_V^2 d_V^2 + \delta_H^2 d_H^2},\, 2\delta_V d_V,\, 2\delta_H d_H\} \quad \text{Equation (10)}$$

where D denotes an objective function, $d_V$ denotes a horizontal distance between antennas, $d_H$ denotes a vertical distance between antennas, $\delta_V$ denotes a vertical distance between two antenna locations, and $\delta_H$ denotes a horizontal distance between two antenna locations.

Equation (11) may be induced from Equation (9) and Equation (10). Equation (11) is expressed by variation from Equation (8) given by:

$$\underset{\delta_V, \delta_H}{\text{maximize}} D = \min\left\{\sqrt{\delta_V^2 d_V^2 + \delta_H^2 d_H^2}, 2\delta_V d_V, 2\delta_H d_H\right\} \quad \text{Equation (11)}$$

$$\text{s.t. } 1 \leq \delta_V \leq N_V - 1, 1 \leq \delta_H \leq N_H - 1, \delta_V, \delta_H \in \mathbb{Z}$$

$$\delta_V \delta_H = B/4, \delta_V | N_V, \delta_H | N_H,$$

where $d_V$ denotes a horizontal distance between antennas, $d_H$ denotes a vertical distance between antennas, $N_V$ denotes the number of antenna columns, $N_H$ denotes the number of antenna rows, $\delta_V$ denotes a vertical distance between two antenna locations, $\delta_H$ denotes a horizontal distance between two antenna locations, and B denotes the number of SFBC blocks. x|y means that x is a factor of y.

By solving the Equation (11) instead of Equation (8), $\delta_V$ and $\delta_H$ that maximize D may be acquired. According to the acquired $\delta_V$ and $\delta_H$, the set $A_l$ that satisfies the minimum distance $d_{min,l}$=D may be configured. In other words, after $\delta_V$ and $\delta_H$ that maximize the minimum distance between antennas based on Equation (11) may be acquired, and then, the set $A_l$ of Equation (9) satisfied with the condition may be configured. By using the repeated grid structure pattern, Equation (11) may innovatively reduce the search size of the objective function D compared to Equation (6) or Equation (8). For example, when a space separation scheme is applied to a linear antenna structure corresponding to an unusual situation, an optimal set $A_l$ may be easily calculated since it is enough to consider only one of a horizontal direction and a vertical direction. In a linear antenna structure of horizontal arrangement in which $N_H$=1, $\delta_V$ and $A_l$ may be acquired as Equation (12). Further, in a linear antenna structure of vertical arrangement in which $N_V$=1, $\delta_H$ and $A_l$ may be acquired as Equation (13). In each case, since $\delta_V$, $\delta_H$, the horizontal distance $d_V$ between antennas, and the vertical distance $d_H$ between antennas are all known, optimal D may be easily calculated and $A_l$ which is satisfied with the optimal D may be easily acquired. That is, a set of antenna locations that maximize the minimum distance between antennas may be relatively simply acquired through Equation (11) which is the proposed space separation scheme:

$$\delta_V = \frac{B}{2}, A_l = \left\{((m-1)\delta_V + l, 1) \mid 1 \leq m \leq \frac{N_V}{\delta_V}\right\}, \quad \text{Equation (12)}$$

$$\text{for } l = 1, \ldots, \frac{B}{2}.$$

$$\delta_H = \frac{B}{2}, A_l = \left\{(1, (n-1)\delta_H + l) \mid 1 \leq n \leq \frac{N_H}{\delta_H}\right\}, \quad \text{Equation (13)}$$

$$\text{for } l = 1, \ldots, \frac{B}{2}.$$

where $\delta_V$ denotes a vertical distance between two antenna locations, $\delta_H$ denotes a horizontal distance between two antenna locations, B denotes the number of SFBC blocks, and $A_l$ denotes a location set.

Figure 11:
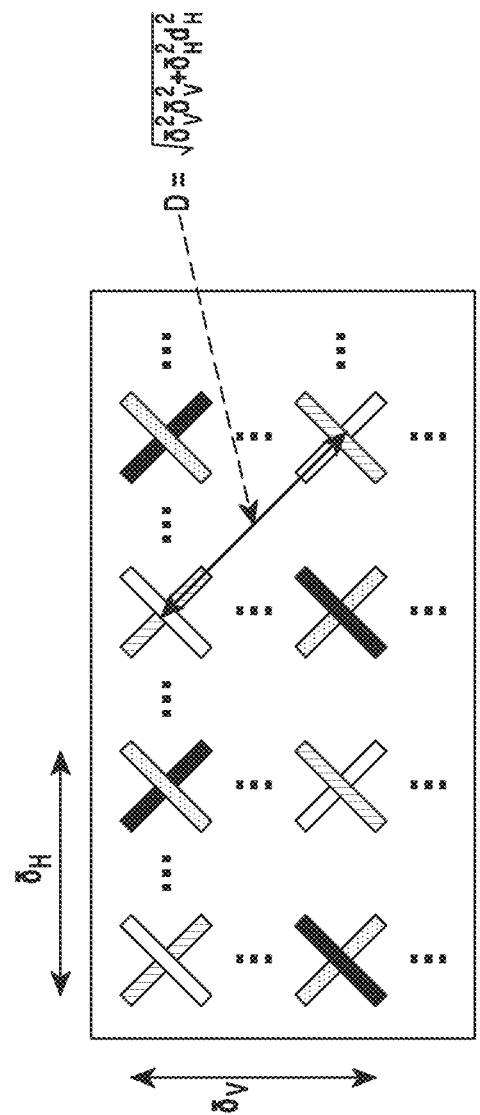
FIG. 11 illustrates an example of polarity separation for antennas having a minimum distance in a wireless communication system according to various embodiments of the present disclosure.

As described above, when the set of antenna locations for transmitting SFBC blocks is acquired, a polarity separation scheme for mapping each SFBC block to each antenna is applied in consideration of polarity between antennas as illustrated in FIG. 11. According to an embodiment, FIG. 11 assumes cross-polarization antenna arrangement in which two antennas having different polarities are arranged at one location. In another embodiment, the number of polarities of antennas may be three or more, and in this case, three or more antennas may be arranged at the same location.

FIG. 11 illustrates an example of separation of polarities of antennas having a minimum distance in a wireless communication system according to various embodiments of the present disclosure. In order to avoid a channel correlation effect between antenna elements having the same polarity, antenna elements having a minimum distance are arranged to have different polarities through the polarity separation scheme. For example, when a set $A_u$ is determined in a space separation step, a set $B_u$ of antenna elements that transmit a $u^{th}$ SFBC block is acquired as Equation (14). That is, as shown in Equation (14), in the set $A_u$ in which the minimum distance between antennas is maximum, antennas having two different polarities may be arranged at the same location:

$$B_u = \begin{cases} \{(m, n, p_{m,n}) \mid (m, n) \in A_u\}, & \text{for } u = 1, \ldots, B/2 \\ \{(m, n, 3 - p_{m,n}) \mid (m, n) \in A_{u-B/2}\}, & \text{for } u = B/2+1, \ldots, B \end{cases} \quad \text{Equation (14)}$$

where $B_u$ denotes a set of antenna elements that transmit a $u^{th}$ SFBC block, B denotes the number of SFBC blocks, and $P_{m,n}$ denotes a polarity of an antenna installed at a location (m, n).

$P_{m,n}$ may be defined as Equation (15):

$$P_{m,n} = \begin{cases} \text{mod}(m, 2) + 1, & \text{if } D = \sqrt{\delta_V^2 d_V^2 + \delta_H^2 d_H^2} \\ \text{mod}(\lceil m/2 \rceil, 2) + 1 & \text{if } D = 2\delta_V d_V \\ \text{mod}(\lceil n/2 \rceil, 2) + 1 & \text{if } D = 2\delta_H d_H \end{cases} \quad \text{Equation (15)}$$

where $P_{m,n}$ denotes a polarity of an antenna installed at a location (m, n), $d_V$ denotes a horizontal distance between antennas, and $d_H$ denotes a vertical distance between antennas. $\delta_V$ denotes a vertical distance between two antenna locations, and $\delta_H$ denotes a horizontal distance between two antenna locations.

For example, referring to FIG. 11, when a maximum value of a minimum distance between antennas is D= $\sqrt{\delta_V^2 d_V^2 + \delta_H^2 d_H^2}$, $B_u$ is determined to make antennas having the minimum distance at diagonal locations have different polarities. According to another embodiment, the SFBC matrix may be replaced with an STBC matrix.

Figure 12:
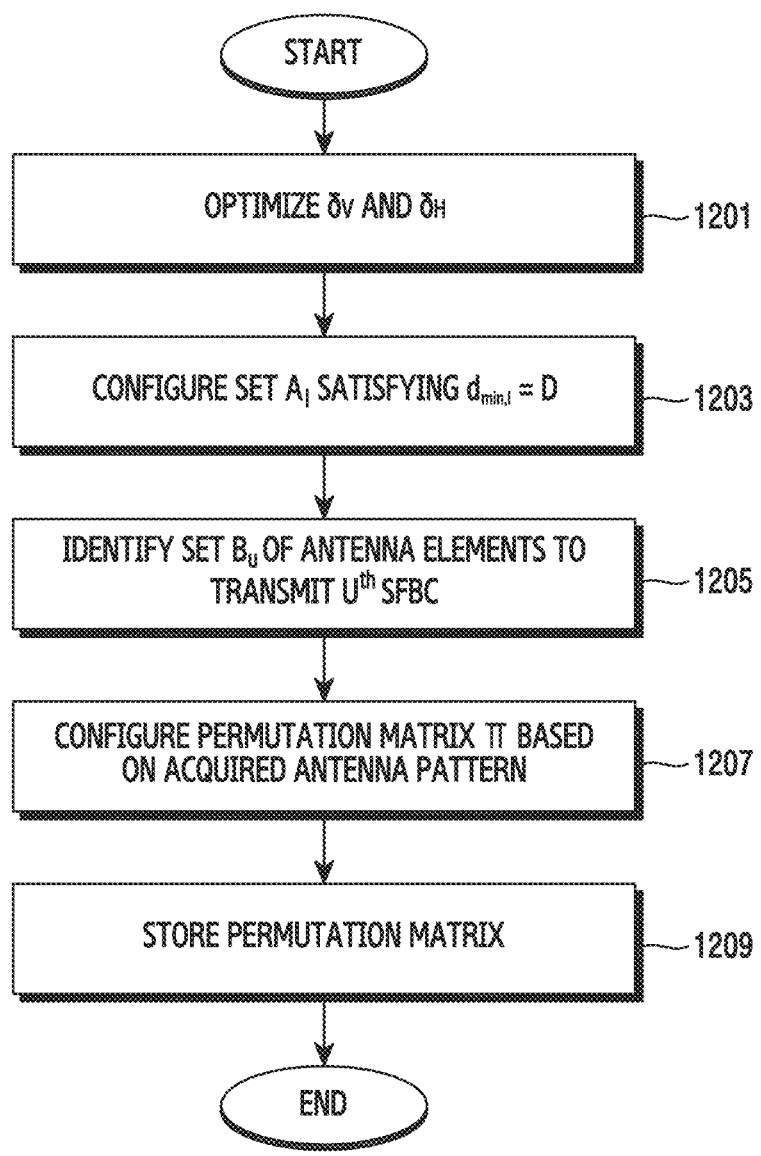
FIG. 12 illustrates a process of calculating a permutation matrix in a wireless communication system according to various embodiments of the present disclosure.

FIG. 12 illustrates a process of calculating a permutation matrix in a wireless communication system according to various embodiments of the present disclosure. A transmitting node described in FIG. 12 may be the transmitting node 110 illustrated in FIG. 2. The operation in FIG. 12 may be performed by the transmitting node or performed by a separate subject. Hereinafter, for convenience of description, the subject for performing the procedure of FIG. 12 is referred to as a "determiner".

Referring to FIG. 12, in step 1201, the determiner optimizes $\delta_V$ and $\delta_H$. In other words, as one of the space separation processes, optimal $\delta_V$ and $\delta_H$ that make a minimum distance between antennas maximum are calculated by a vertical distance $\delta_V$ and a horizontal distance $\delta_H$ between two antenna locations. For example, the determiner determines $\delta_V$ and $\delta_H$ that maximize D as shown in Equation (11).

In step 1203, the determiner configures a location set $A_I$ that satisfies a minimum distance $d_{min,I}$=D according to $\delta_V$ and $\delta_H$ acquired in step 1201. In other words, after determining $\delta_V$ and $\delta_H$ that maximize the minimum distance between antennas, the determiner may configure the location set $A_I$ as shown in Equation (9) that satisfies the condition.

In step 1205, according to an embodiment, the determiner identifies a set $B_u$ of antenna elements to transmit a $u^{th}$ SFBC block. In other words, in order to avoid a channel correlation effect between antenna elements having the same polarity, the determiner arranges antenna elements having the minimum distance to have different polarities according to a polarity separation scheme. That is, the determiner may arrange cross-polarization antennas having the minimum distance to have different polarities in the location set that maximizes the minimum distance between antennas acquired in step 1203. When the set $A_u$ is determined in the previous step, the set $B_u$ of antenna elements that transmit the $u^{th}$ SFBC block may be acquired as Equation (14).

In step 1207, the determiner configures a permutation matrix Π based on the acquired antenna pattern. According to an embodiment, based on the set $B_u$ of the antenna elements that transmit the $u^{th}$ SFBC block determined through the above-described steps, the determiner may configure the permutation matrix for mixing rows of the SFBC block. According to another embodiment, the SFBC block may be replaced with an STBC block. Specifically, the permutation matrix may be a matrix in which each element that indicates the antenna, to which signals transmitted through each antenna are transmitted before the permutation, has a value of 1 or 0.

In step 1209, the determiner stores the configured permutation matrix Π. In other words, the determiner stores the permutation matrix acquired by the above-described steps. Accordingly, the transmitting node (for example, the determiner or the transmitting node 110) may select the corresponding permutation matrix according to the number of sub-blocks (for example, SFBC blocks) and an antenna arrangement structure (for example, the number of rows and the number of columns). According to another embodiment, the permutation matrix may be calculated according to the necessity at a time point when data is transmitted. According to another embodiment, the permutation matrix may be calculated in advance and stored in the storage (for example, the storage 230), and one of the stored matrixes may be selectively applied when the application of the permutation matrix is required.

Figure 13:
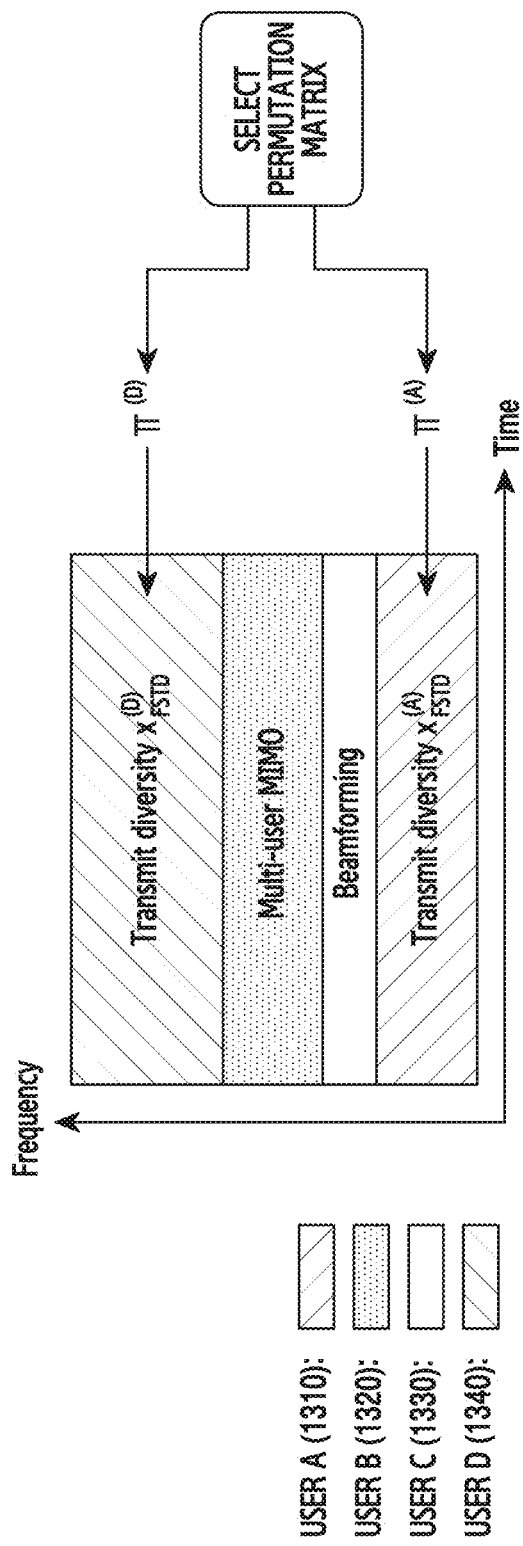
FIG. 13 illustrates an example of various transmission modes for a plurality of users in a wireless communication system according to various embodiments of the present disclosure.

FIG. 13 illustrates an example of various transmission modes for a plurality of users in a wireless communication system according to various embodiments of the present disclosure. Referring to FIG. 13, in a general multi-user environment, the transmitting node may allocate different transmission modes to respective users. For example, user A 1310 and user D 1340 may receive services in a transmit diversity mode. However, user B 1320 and user C 1330 may receive services through a multi-user MIMO mode and a beamforming mode based on a closed-loop, respectively. As illustrated in FIG. 13, the transmitting node may perform transmission by applying the permutation matrix only to user A 1310 and user D 1340 who receive services in the transmit diversity mode, and may provide transmission modes suitable for situations to users in the transmission mode based on the closed-loop such as user B 1320 and user C 1330 without additional operation. According to an embodiment, the transmission mode of each user may be determined by channel quality feedback information received from each user. In the multi-user environment of the wireless communication system, embodiments of the operation of the transmitting node according to channel quality feedback of each user will be described below.

Figure 14:
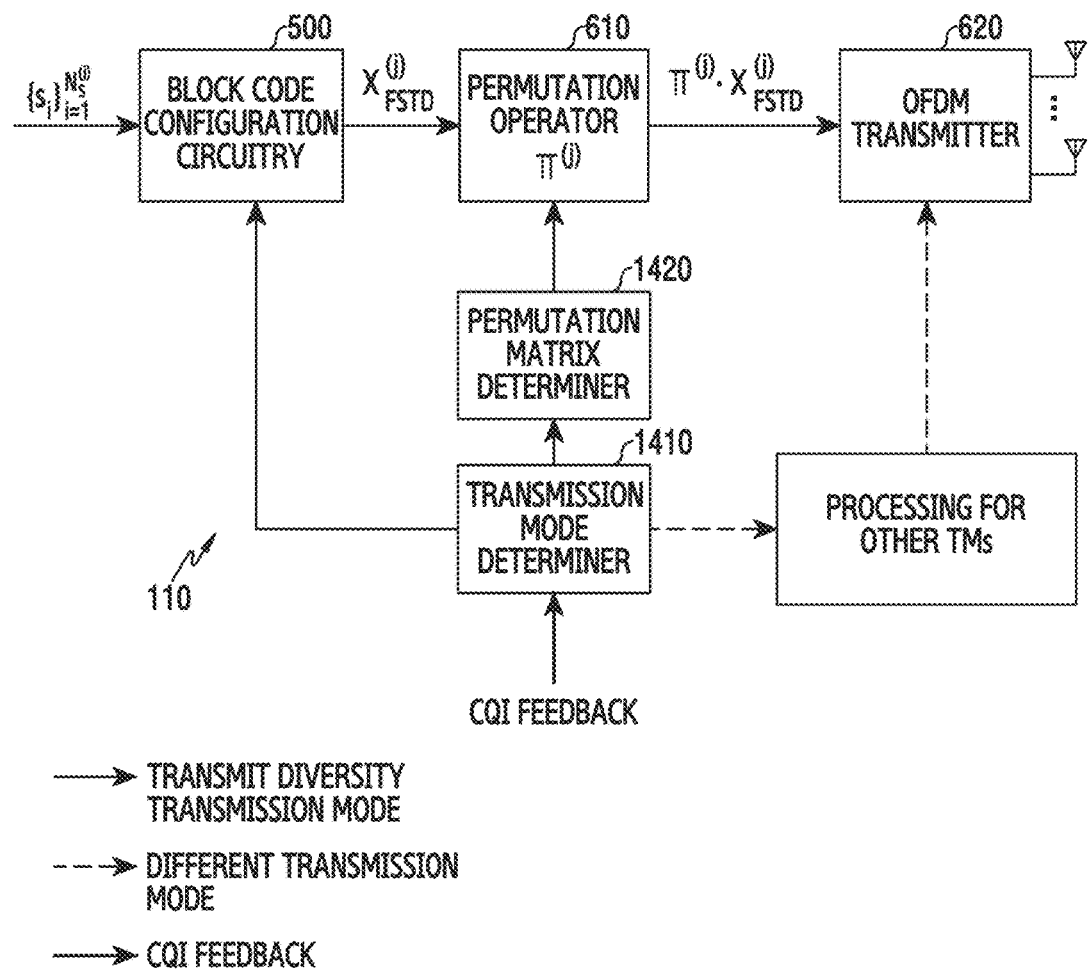
FIG. 14 illustrates an example of a transmitting node operating based on user's channel quality feedback in a wireless communication system according to various embodiments of the present disclosure.

FIG. 14 illustrates the transmitting node 110 that operates based on channel quality feedback of the user in a wireless communication system according to various embodiments of the present disclosure. Referring to FIG. 14, the transmitting node 110 includes the block code configuration circuitry 500, the permutation operator 610, the OFDM transmitter 620, a transmission mode determiner 1410, and a permutation matrix determiner 1420.

The transmission mode determiner 1410 may select a transmission mode based on channel quality feedback information received from the user terminal (for example, the receiving node 120). The channel quality feedback information may be a channel quality indicator (CQI). The channel quality may include at least one of a signal to interference and noise ratio (SINR), a signal to noise ratio (SNR), and a carrier to interference and noise ratio (CINR).

When the transmission mode determiner 1410 selects the transmit diversity mode for user j based on channel quality feedback information, the block code configuration circuitry 500 block-codes transmission signals for user j. For example, in an FSTD-A scheme, the block code configuration circuitry 500 may generate a matrix $X_{FSTD}^{(j)}$ in which SFBC blocks corresponding to $N_s^{(j)}$ data symbols for user j are orthogonally arranged on a frequency domain.

The permutation matrix determiner 1420 may determine the permutation matrix according to the block code scheme used by the block code configuration circuitry 500. The permutation matrix may be selected from the pre-calculated and stored values or may be calculated and determined from parameters whenever necessary. The permutation matrix corresponds to a matrix for mapping symbols to antennas in consideration of antenna locations and polarities in order to reduce the channel correlation between antennas that transmit symbols sharing the same time-frequency resources. For example, in the block code through the FSTD-A scheme, the permutation matrix determiner 1420 determines a permutation matrix $\Pi^{(j)}$ in consideration of the number of blocks and an antenna arrangement structure.

The permutation operator 610 applies the determined permutation matrix to codes coded by the block code configuration circuitry 500. That is, the permutation operator 610 multiplies the selected permutation matrix $\Pi^{(j)}$ and the matrix $X_{FSTD}^{(j)}$ and maps the products to antennas for transmitting symbols.

The OFDM transmitter 620 generates OFDM symbols by OFDM-modulating the symbols generated based on the block code and the permutation operation and transmits the OFDM symbols through a plurality of antennas.

When the transmission mode determiner 1410 selects different transmission modes for users based on channel quality feedback information (for example, beamforming mode based on closed-loop), the transmitting node 110 may perform the corresponding operation and then transmit a signal through the OFDM transmitter 620.

Figure 15:
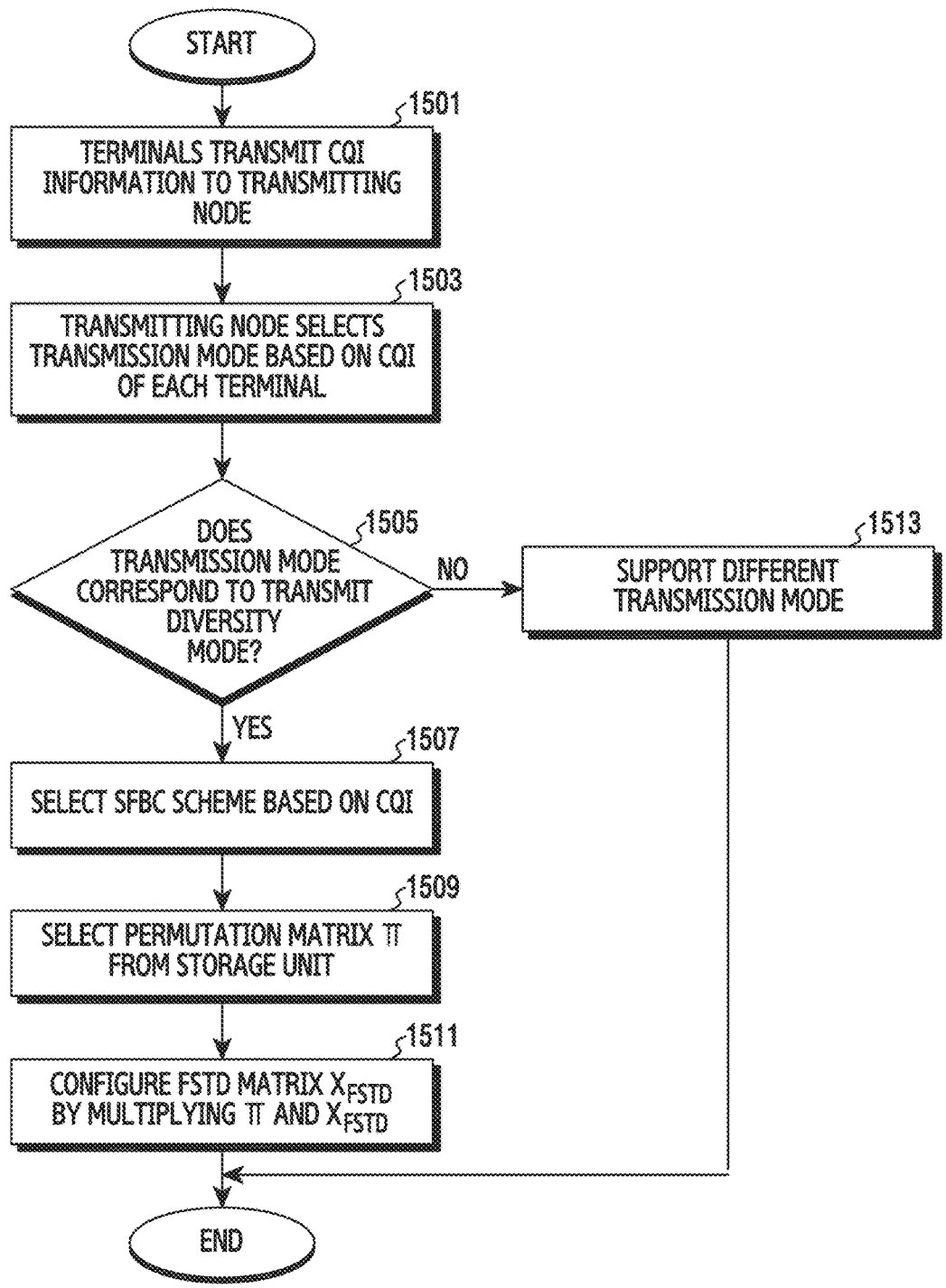
FIG. 15 illustrates a process of applying a permutation matrix based on user's channel quality feedback in a wireless communication system according to various embodiments of the present disclosure.

FIG. 15 illustrates a process of applying the permutation matrix based on user's channel quality feedback in a wireless communication system according to various embodiments of the present disclosure.

Referring to FIG. 15, in step 1501, user terminals transmit CQI information to the transmitting node according to an embodiment. That is, the transmitting node may receive the CQI information from the receiving node to receive the signal. According to an embodiment, the transmitting node may be a base station. According to another embodiment, channel quality information as well as the CQI information may be transmitted.

In step 1503, the transmitting node selects a transmission mode based on CQI information of each terminal. In other words, the transmitting node may determine the transmission mode according to the channel quality information received from each terminal. According to an embodiment, the transmission mode may be one of the transmission modes of a downlink channel defined in the 3$^{rd}$ Generation Partnership Project (3GPP) standard.

In step 1505, it is determined whether the transmission mode selected by the transmitting node is a transmit diversity mode. For example, the transmitting node determines the transmission mode based on the received channel quality information and determines whether the determined transmission mode is the transmit diversity mode. When the transmitting node selects the transmit diversity mode, the transmitting node proceeds to step 1507. When the transmitting node selects a mode other than the transmit diversity mode, the transmitting node proceeds to step 1513.

In step 1507, the transmitting node selects an SFBC scheme based on CQI information. According to various embodiments of the present disclosure, code matrix schemes such as Jafarkhani (H. Jafarkhani, "A quasi-orthogonal space-time block code," IEEE TCOM, 2001), Tirkkonen-Hottinen (O. Tirkkonen et. al., "Square-matrix embeddable space-time block codes for complex signal constellations," IEEE TIT, 2002), Trikkonen-Boariu-Hottinen (O. Tirkkonen et. al., "Minimal nonorthogonality rate 1 space-time block code for 3+Tx antennas," IEEE ISSSTA, 2000), Su-Xia (W. Su et. al., "Signal constellations for quasi-orthogonal space-time block codes with full diversity," IEEE TIT, 2004), Tarokh-Jafarkhani-Calderbank 1 (V. Tarokh et. al., "Space-time block codes from orthogonal designs," IEEE TIT, 1999), Tarokh-Jafarkhani-Calderbank 2 (V. Tarokh et. al., "Space-time block codes from orthogonal designs," IEEE TIT, 1999), Kim (J. Kim et. al., "STBC/SFBC for 4 transmit antennas with 1-bit feedback," IEEE ICC, 2008), Murthy-Gowri (N. S. Murthya et. al., "Full rate general complex orthogonal space-time block code for 8-transmit antenna," IWIEE, 2012), Erotokritou (I. D. Erotokritou, "Space-time block coding for multiple transmit antennas over time-selective fading channels" Louisiana State University, May, 2006), Tran-Seberry-Wang-Wysocki (L. C. Tran et. al., "Two new complex orthogonal space time codes for 8 transmit antennas," University of Wollongong, 2004) as well as Alamouti may be applied.

In step 1509, the transmitting node selects a permutation matrix Π from the storage. According to an embodiment, the transmitting node may select the permutation matrix Π based on a selected SFBC scheme-related parameter (for example, the number of SFBC blocks) and an antenna arrangement structure (for example, the number of rows and the number of columns). The permutation matrix Π may be calculated in advance and stored in the storage, or the transmitting node may calculate and select a permutation matrix suitable for the SFBC scheme whenever necessary.

In step 1511, the transmitting node configures a new mapping matrix by multiplying the block code matrix and the permutation matrix. According to an embodiment, the transmitting node may configure the matrix by multiplying an FSTD mapping matrix $X_{FSTD}$ and the permutation matrix Π.

In step 1513, the transmitting node supports a different transmission mode. In other words, when the transmission mode of the transmitting node is selected as a mode other than the transmit diversity mode, the transmitting node operates to support a different transmission mode.

FIGS. 16 to 29 illustrate performance experiment results in a wireless communication system according to various embodiments of the present disclosure. That is, for the permutation operation according to the present disclosure, results of the performance experiment under an experiment environment of [Table 1] are as shown in FIGS. 16 to 29. In order to verify the performance of the permutation operation proposed by the present disclosure, the performance experiments of FIGS. 17 to 29 are conducted under three antenna arrangement conditions (8×1, 8×8, and 1×8) of the transmitting node. To show the criterion of the performance, FIGS. 17 to 29 also illustrate a block error rate (BLER) of the Alamouti scheme in 2×1 of the transmission antenna arrangement. FSTD-A, FSTD-PSD, and FSTD-E-PSD schemes are assumed to verify the performance. In FIGS. 16 to 29, horizontal axes of graphs indicate a value of Eb/No corresponding to an Energy per bit to noise density ratio and is expressed by the unit of dB. Vertical axes of graphs indicate a value of BLER corresponding to an block error ratio and is expressed by a probability value equal to or smaller than 1. Since the performance is better as the block error ratio is lower for the same Eb/No value, a lower side on the graph means that the performance of the transmitting node is improved.

TABLE 1

| System parameter | Value |
|---|---|
| Tx configuration | Multi-antenna, XPOL 45°, omni-beam |
| Rx configuration | Single-antenna, COPOL, omni-beam |
| Scenario | UMi3D, NLOS |
| Carrier frequency | 2 Ghz |
| Velocity | 3 km/h |
| FFT size | 1024 |
| Modulation | 4-QAM |
| Channel coding | Turbo code with code rate $R_C = \frac{1}{2}, \frac{3}{4}$ |

Figure 16:
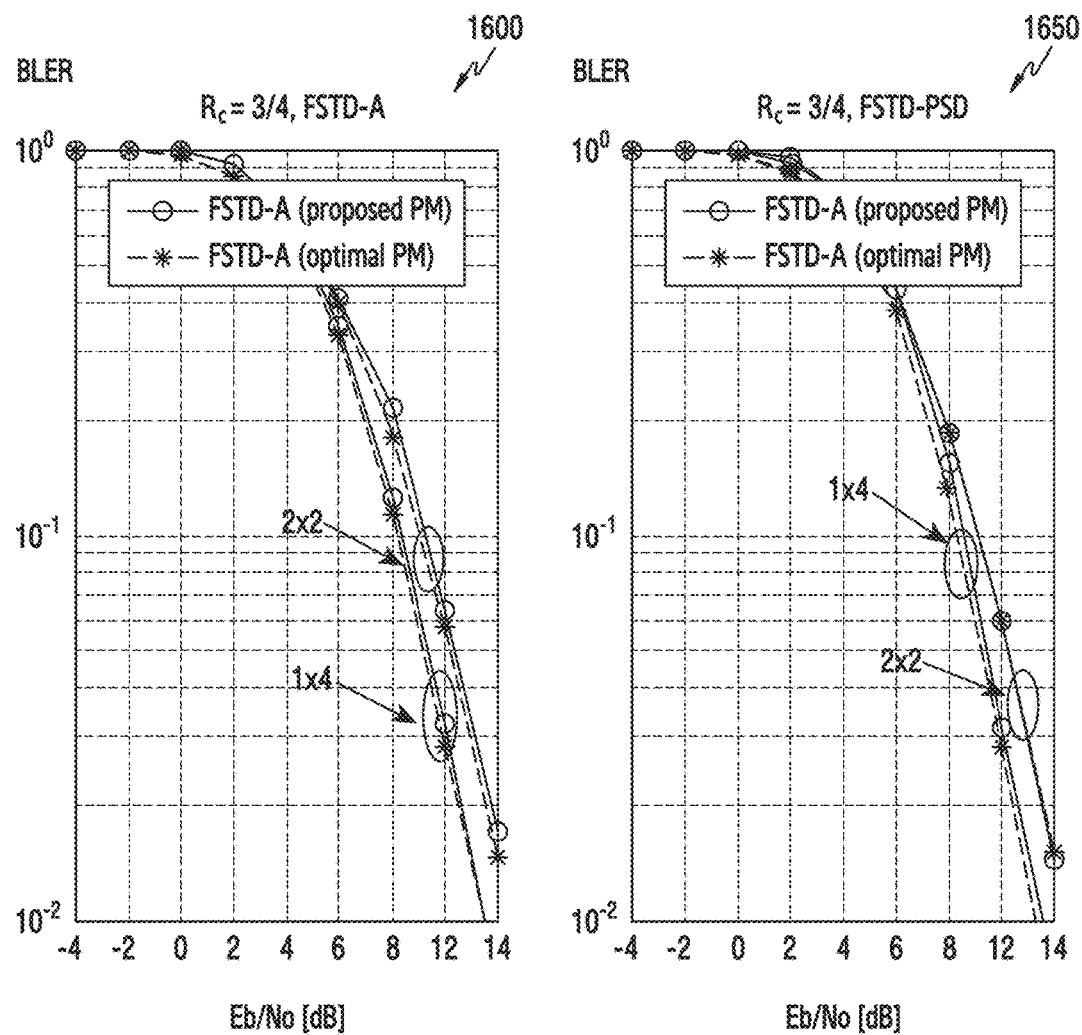
FIGS. 16 to 29 illustrate performance experiment results in a wireless communication system according to various embodiments of the present disclosure.

FIG. 16 illustrates the performance of an optimal permutation method and a proposed permutation method in 2×2 and 1×4 of transmission antenna arrangements. FIG. 16 includes a performance graph 1600 using the FSTD-A scheme and a performance graph 1650 using the FSTD-PSD scheme. Referring to FIG. 16, it is noted that there is little difference between the proposed performance scheme graph and the optimal permutation scheme graph. At this time, the optimal permutation scheme has a search size of $N_T! = 8! = 40320$ in a condition of cross-polarization antennas arranged in 2×2. In contrast, the proposed permutation scheme finds the solution of Equation (11), in which only one feasible solution exists. As illustrated in FIG. 16, the proposed permutation scheme may acquire a very large gain in complexity of calculations with little performance difference from the optimal permutation scheme.

Figure 17:
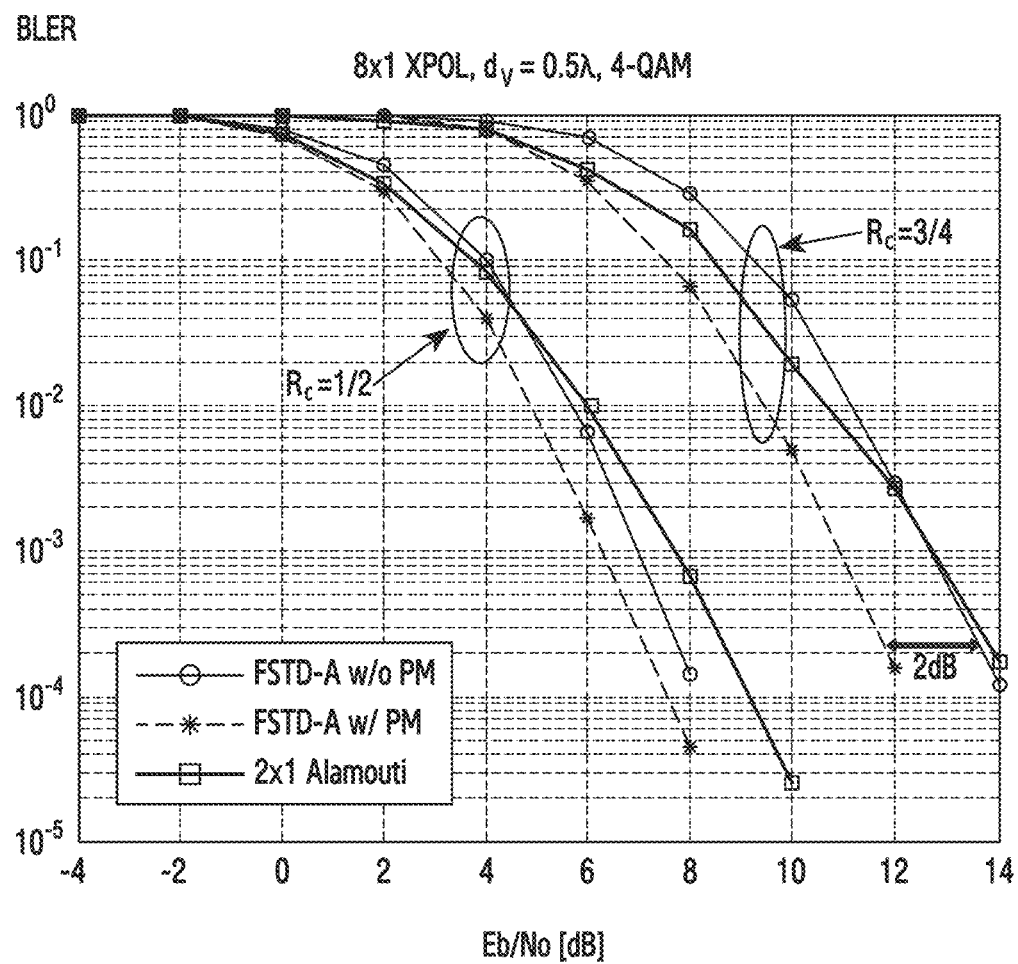

FIG. 17 illustrates a performance experiment result using the FSTD-A scheme in an environment where the transmission antenna arrangement is 8×1 and a vertical distance $d_V$ between antennas is 0.5λ. FIG. 17 also illustrates a BLER performance graph using an Alamouti code when the transmission antenna arrangement is 2×1 in order to present the criterion of the performance. Referring to FIG. 17, in both cases where a code rate $R_C$ is ½ and ¾, a lower BLER is acquired when the proposed permutation scheme is applied in most intervals. Further, according to an embodiment, a performance gain of the proposed permutation scheme is about 2 dB.

Figure 18:
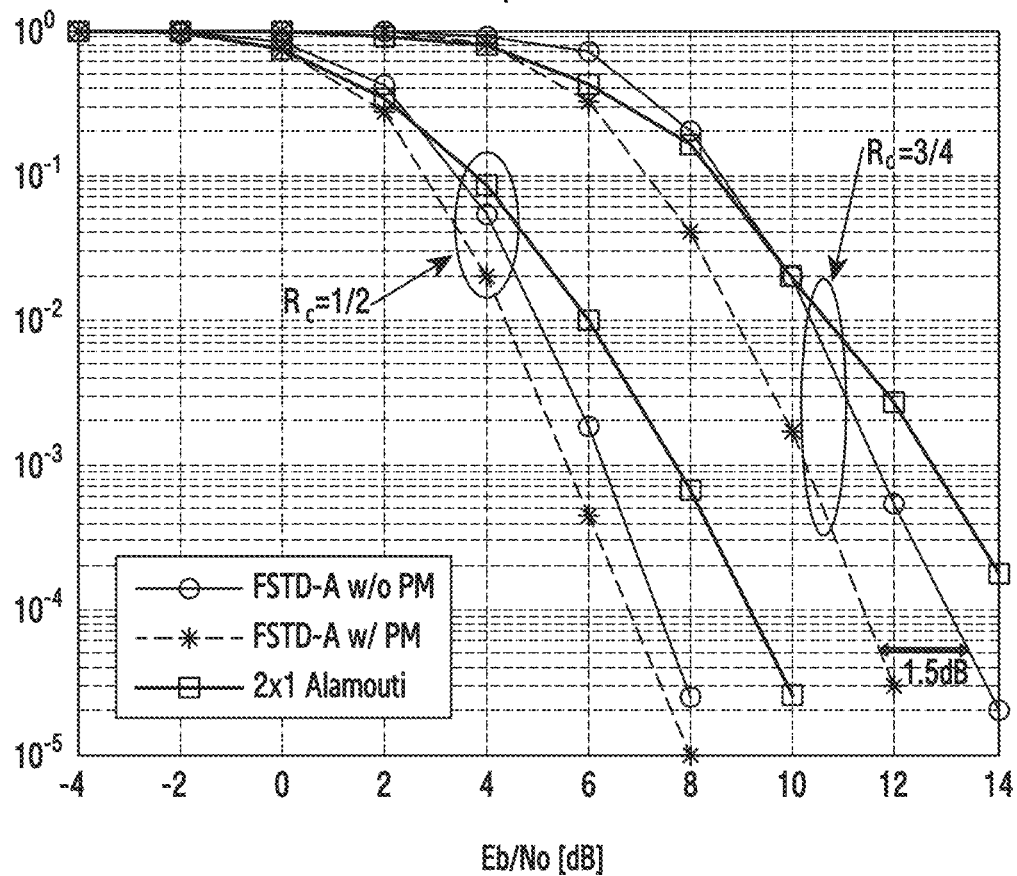

FIG. 18 illustrates a performance experiment result using the FSTD-A scheme in an environment where the transmission antenna arrangement is 8×1 and a vertical distance $d_V$ between antennas is 0.8λ. FIG. 18 also illustrates a BLER performance graph using an Alamouti code when the transmission antenna arrangement is 2×1 in order to present the criterion of the performance. Referring to FIG. 18, in both cases where a code rate $R_C$ is ½ and ¾, a lower BLER is acquired when the proposed permutation scheme is applied in most intervals. According to an embodiment, a performance gain of the proposed permutation scheme is about 1.5 dB.

Figure 19:
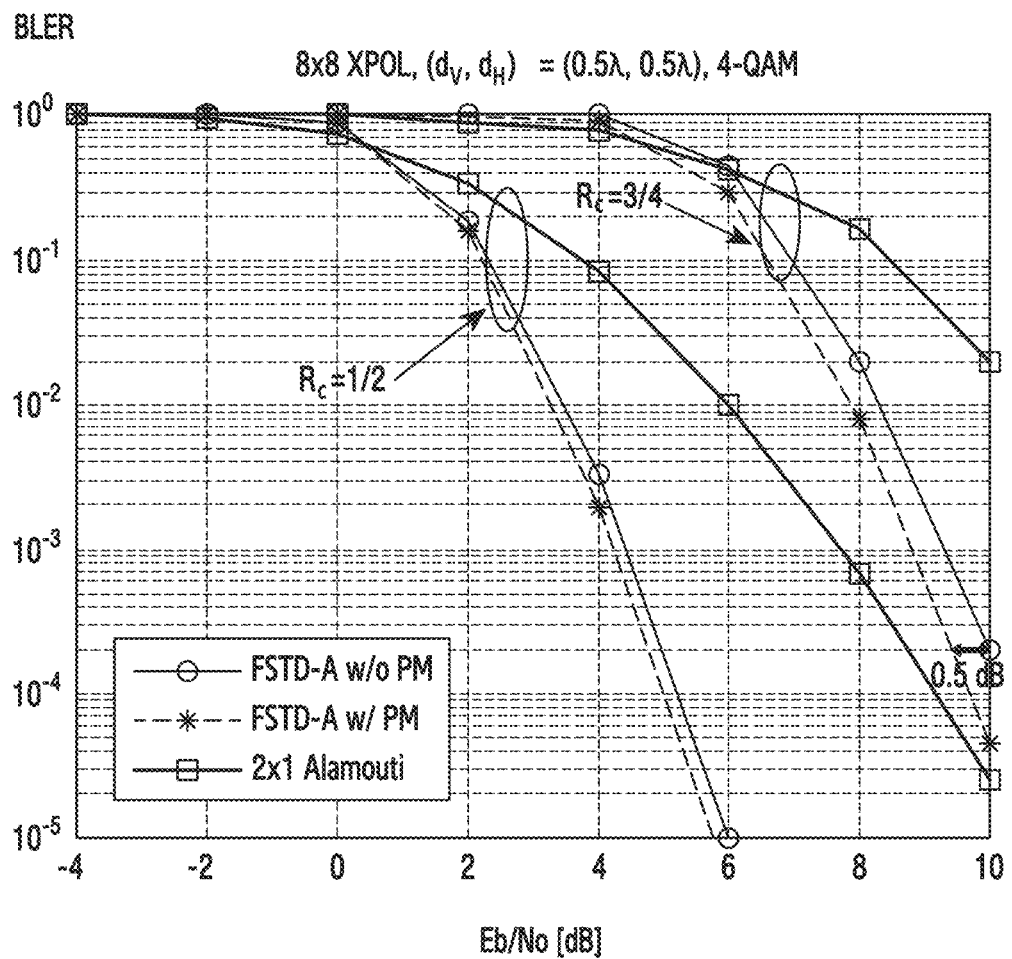

FIG. 19 illustrates a performance experiment result using the FSTD-A scheme in an environment where the transmission antenna arrangement is 8×8 and a vertical distance and a horizontal distance ($d_V$, $d_H$) between antennas is (0.5λ, 0.5λ). FIG. 19 also illustrates a BLER performance graph using an Alamouti code when the transmission antenna arrangement is 2×1 in order to present the criterion of the performance. Referring to FIG. 19, in both cases where a code rate $R_C$ is ½ and ¾, a lower BLER is acquired when the proposed permutation scheme is applied in most intervals. According to an embodiment, a performance gain of the proposed permutation scheme is about 0.5 dB.

Figure 20:
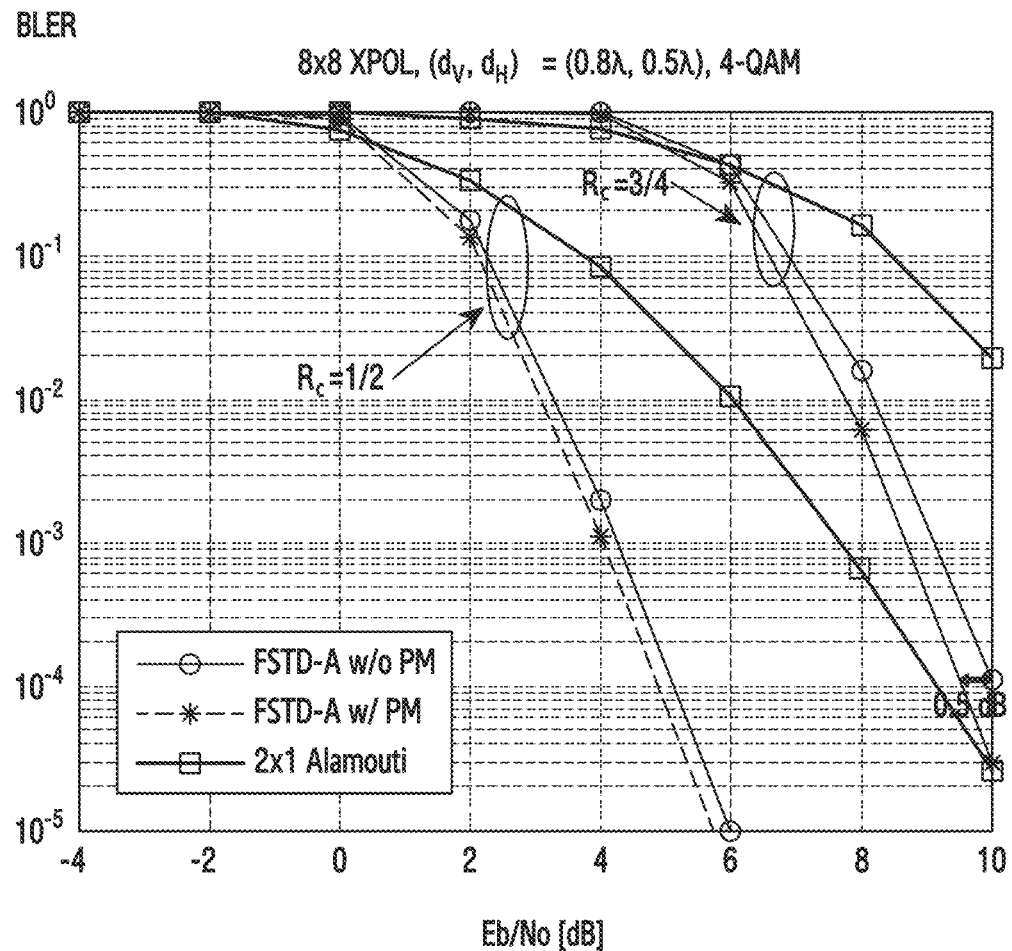

FIG. 20 illustrates a performance experiment result using the FSTD-A scheme in an environment where the transmission antenna arrangement is 8×8 and a vertical distance and a horizontal distance ($d_V$, $d_H$) between antennas is (0.8λ, 0.5λ). FIG. 20 also illustrates a BLER performance graph using an Alamouti code when the transmission antenna arrangement is 2×1 in order to present the criterion of the performance. Referring to FIG. 20, in both cases where a code rate $R_C$ is ½ and ¾, a lower BLER is acquired when the proposed permutation scheme is applied in most intervals. According to an embodiment, a performance gain of the proposed permutation scheme is about 0.5 dB.

Figure 21:
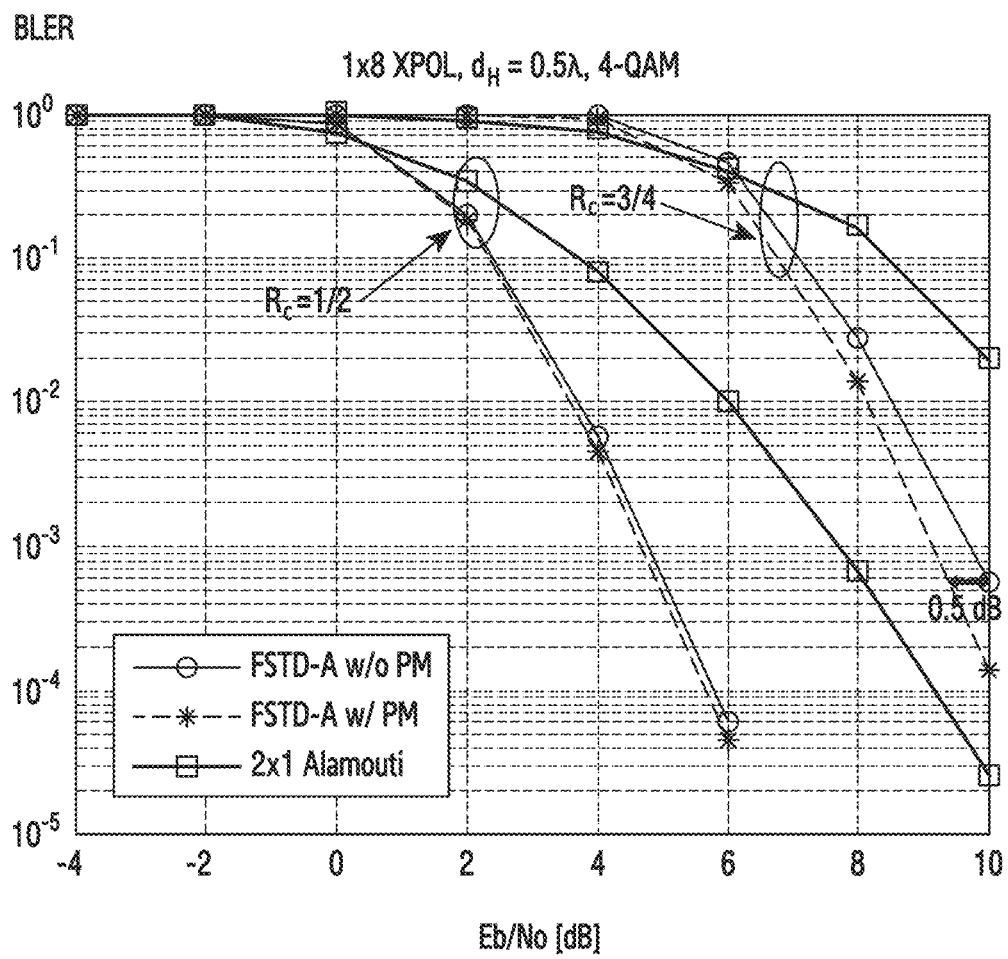

FIG. 21 illustrates a performance experiment result using the FSTD-A scheme in an environment where the transmission antenna arrangement is 1×8 and a horizontal distance $d_H$ between antennas is 0.5λ. FIG. 21 also illustrates a BLER performance graph using an Alamouti code when the transmission antenna arrangement is 2×1 in order to present the criterion of the performance. Referring to FIG. 21, in both cases where a code rate $R_C$ is ½ and ¾, a lower BLER is acquired when the proposed permutation scheme is applied in most intervals. According to an embodiment, a performance gain of the proposed permutation scheme is about 0.5 dB.

Referring to FIGS. 17 to 21, the proposed permutation scheme may have better performance when the channel correlation is high, that is, when the distance between the antennas is narrower and in a Uniform Linear Array (ULA) environment in which antennas are vertically arranged.

Figure 22:
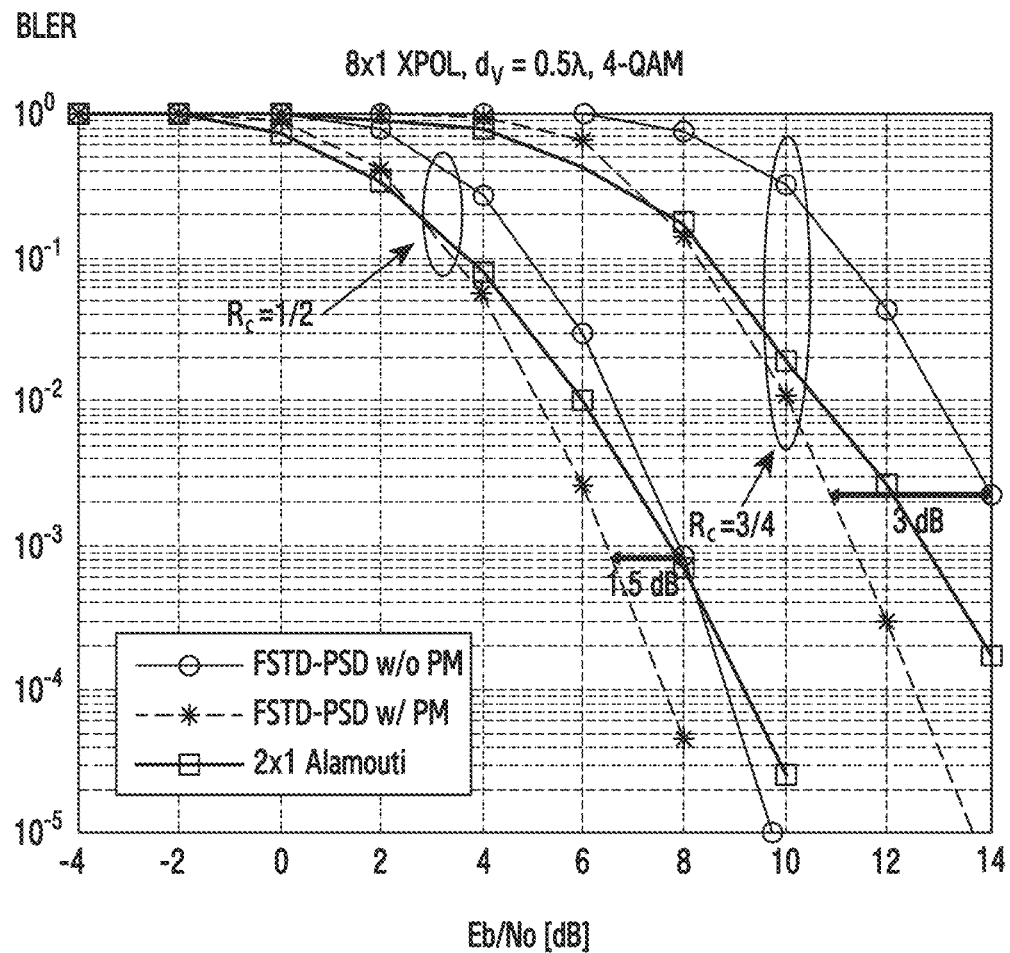

FIG. 22 illustrates a performance experiment result using the FSTD-PSD scheme in an environment where the transmission antenna arrangement is 8×1 and a vertical distance $d_V$ between antennas is 0.5λ. FIG. 22 also illustrates a BLER performance graph using an Alamouti code when the transmission antenna arrangement is 2×1 in order to present the criterion of the performance. Referring to FIG. 22, in both cases where a code rate $R_C$ is ½ and ¾, a lower BLER is acquired when the proposed permutation scheme is applied in most intervals. According to an embodiment, a performance gain of the proposed permutation scheme is about 1.5 dB to 3 dB.

Figure 23:
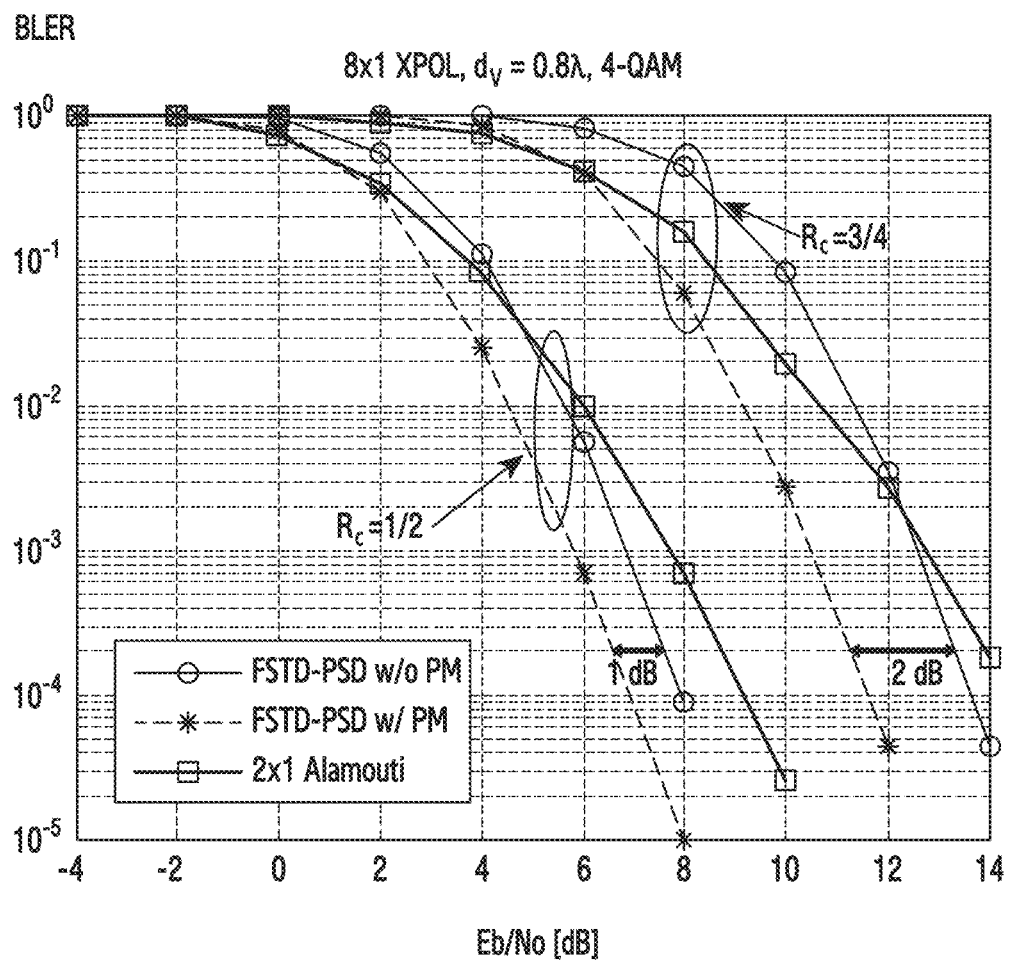

FIG. 23 illustrates a performance experiment result using the FSTD-PSD scheme in an environment where the transmission antenna arrangement is 8×1 and a vertical distance $d_V$ between antennas is 0.8λ. FIG. 23 also illustrates a BLER performance graph using an Alamouti code when the transmission antenna arrangement is 2×1 in order to present the criterion of the performance. Referring to FIG. 23, in both cases where a code rate $R_C$ is ½ and ¾, a lower BLER is acquired when the proposed permutation scheme is applied in most intervals. According to an embodiment, a performance gain of the proposed permutation scheme is about 1 dB to 2 dB.

Figure 24:
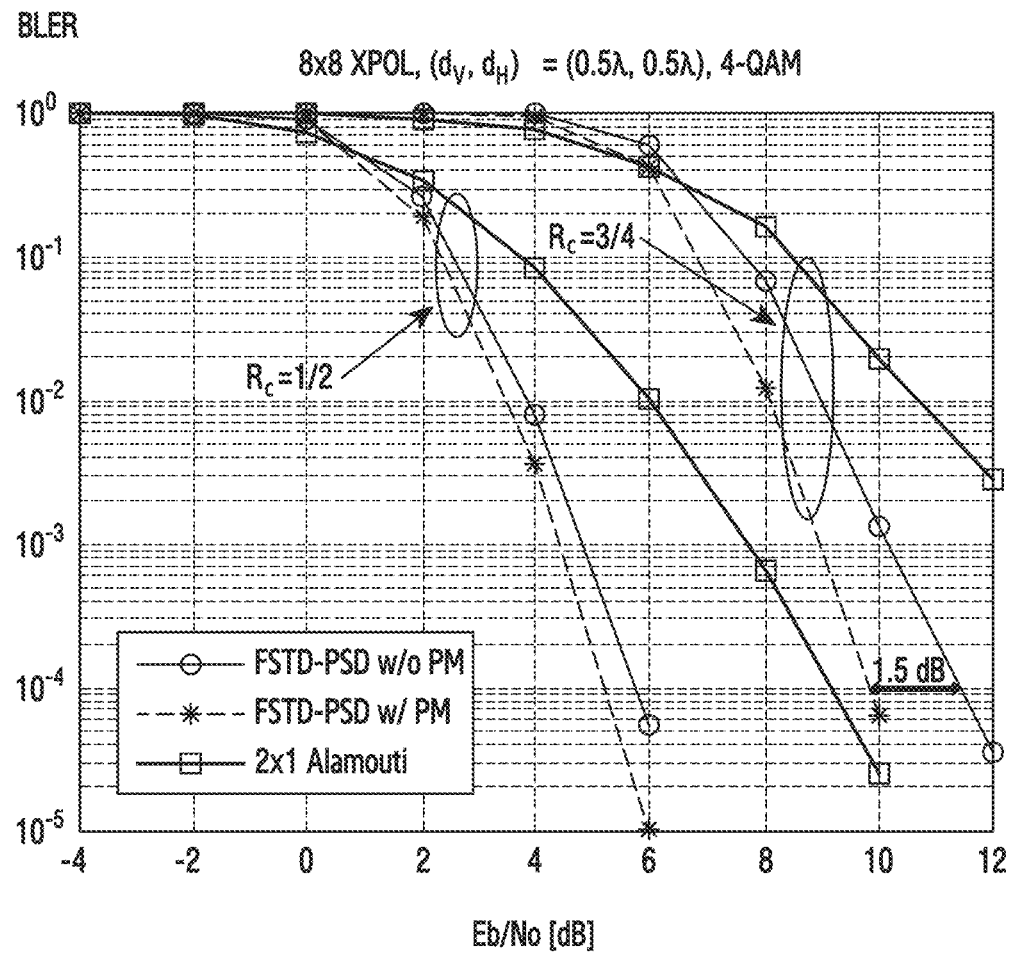

FIG. 24 illustrates a performance experiment result using the FSTD-PSD scheme in an environment where the transmission antenna arrangement is 8×8 and a vertical distance and a horizontal distance ($d_V$, $d_H$) between antennas is (0.5λ, 0.5λ). FIG. 24 also illustrates a BLER performance graph using an Alamouti code when the transmission antenna arrangement is 2×1 in order to present the criterion of the performance. Referring to FIG. 24, in both cases where a code rate $R_C$ is ½ and ¾, a lower BLER is acquired when the proposed permutation scheme is applied in most intervals. According to an embodiment, a performance gain of the proposed permutation scheme is about 1.5 dB.

Figure 25:
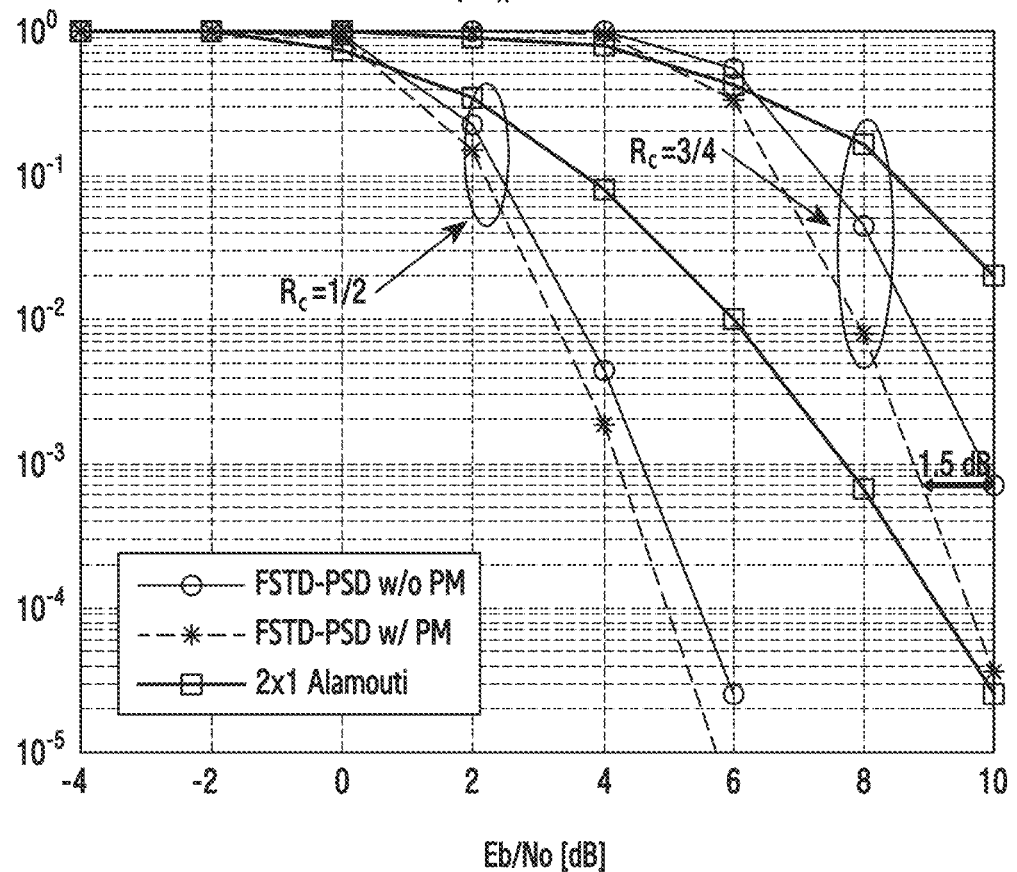

FIG. 25 illustrates a performance experiment result using the FSTD-PSD scheme in an environment where the transmission antenna arrangement is 8×8 and a vertical distance and a horizontal distance ($d_V$, $d_H$) between antennas is (0.8λ, 0.5λ). FIG. 25 also illustrates a BLER performance graph using an Alamouti code when the transmission antenna arrangement is 2×1 in order to present the criterion of the performance. Referring to FIG. 25, in both cases where a code rate $R_C$ is ½ and ¾, a lower BLER is acquired when the proposed permutation scheme is applied in most intervals. According to an embodiment, a performance gain of the proposed permutation scheme is about 1.5 dB.

Figure 26:
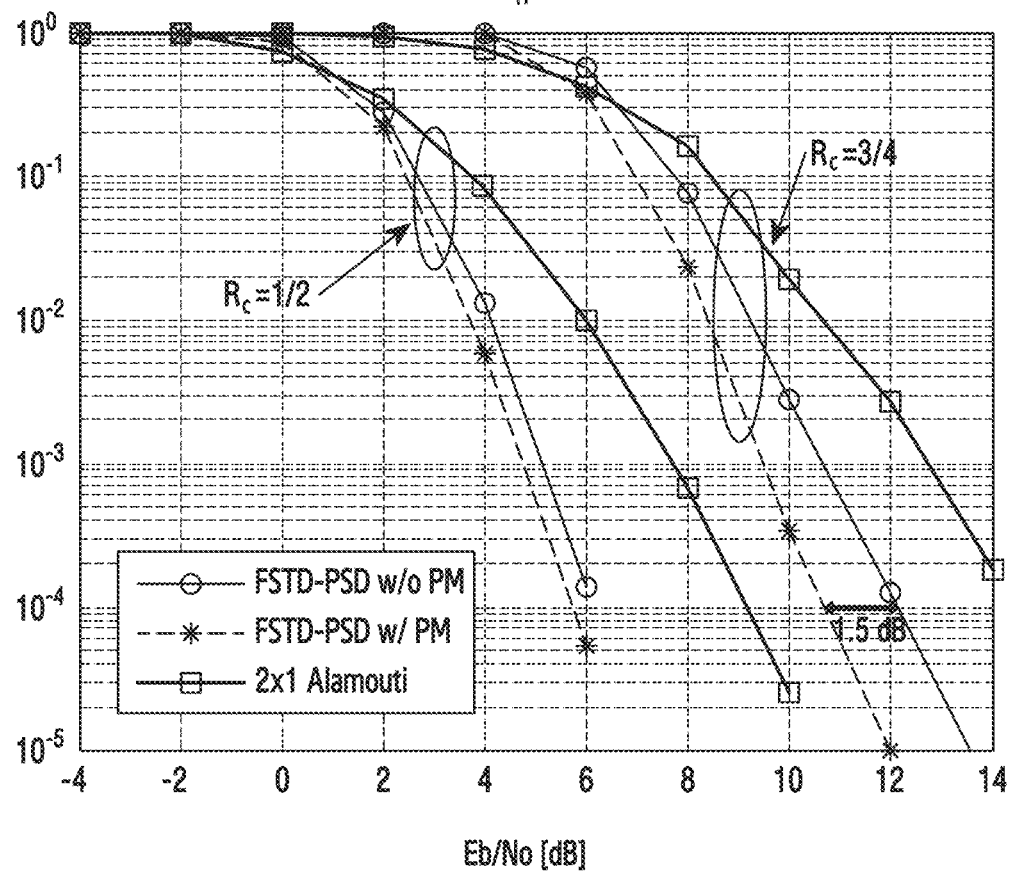

FIG. 26 illustrates a performance experiment result using the FSTD-PSD scheme in an environment where the transmission antenna arrangement is 1×8 and a horizontal distance $d_H$ between antennas is 0.5λ. FIG. 26 also illustrates a BLER performance graph using an Alamouti code when the transmission antenna arrangement is 2×1 in order to present the criterion of the performance. Referring to FIG. 26, in both cases where a code rate $R_C$ is ½ and ¾, a lower BLER is acquired when the proposed permutation scheme is applied in most intervals. According to an embodiment, a performance gain of the proposed permutation scheme is about 1.5 dB.

Referring to FIGS. 22 to 26, the performance gain of about 1 to 3 dB is acquired when the FSTD-PSD scheme is used, which is narrowly increased compared to the FSTD-A scheme. According to an embodiment, since four antennas may be spaced apart from each other in the FSTD-PSD scheme, the FSTD-PSD scheme may be more sensitive to the channel correlation compared to the FSTD-A scheme in which only two antennas are spaced apart from each other.

Figure 27:
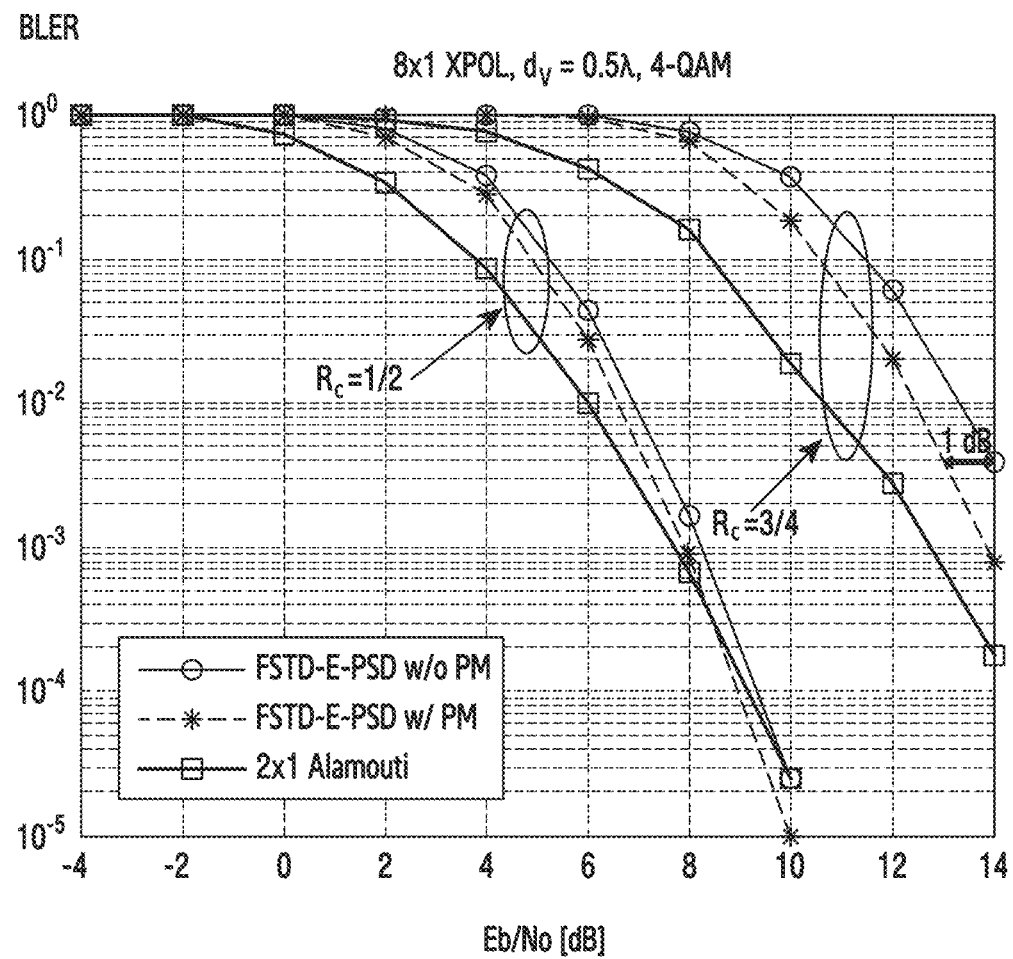

FIG. 27 illustrates a performance experiment result using the FSTD-PSD scheme in an environment where the transmission antenna arrangement is 8×1 and a vertical distance $d_V$ between antennas is 0.5λ. FIG. 27 also illustrates a BLER performance graph using an Alamouti code when the transmission antenna arrangement is 2×1 in order to present the criterion of the performance. Referring to FIG. 27, in both cases where a code rate $R_C$ is ½ and ¾, a higher BLER is acquired in a case where the proposed permutation scheme is applied compared to a case where the Alamouti code is used. According to an embodiment, since eight antennas may be spaced apart from each other in the FSTD-E-PSD scheme, the FSTD-E-PSD scheme is more sensitive to the channel correlation, but a performance gain is rather reduced when antennas are arranged in 8×1. It is because separating all the eight antennas is difficult.

Figure 28:
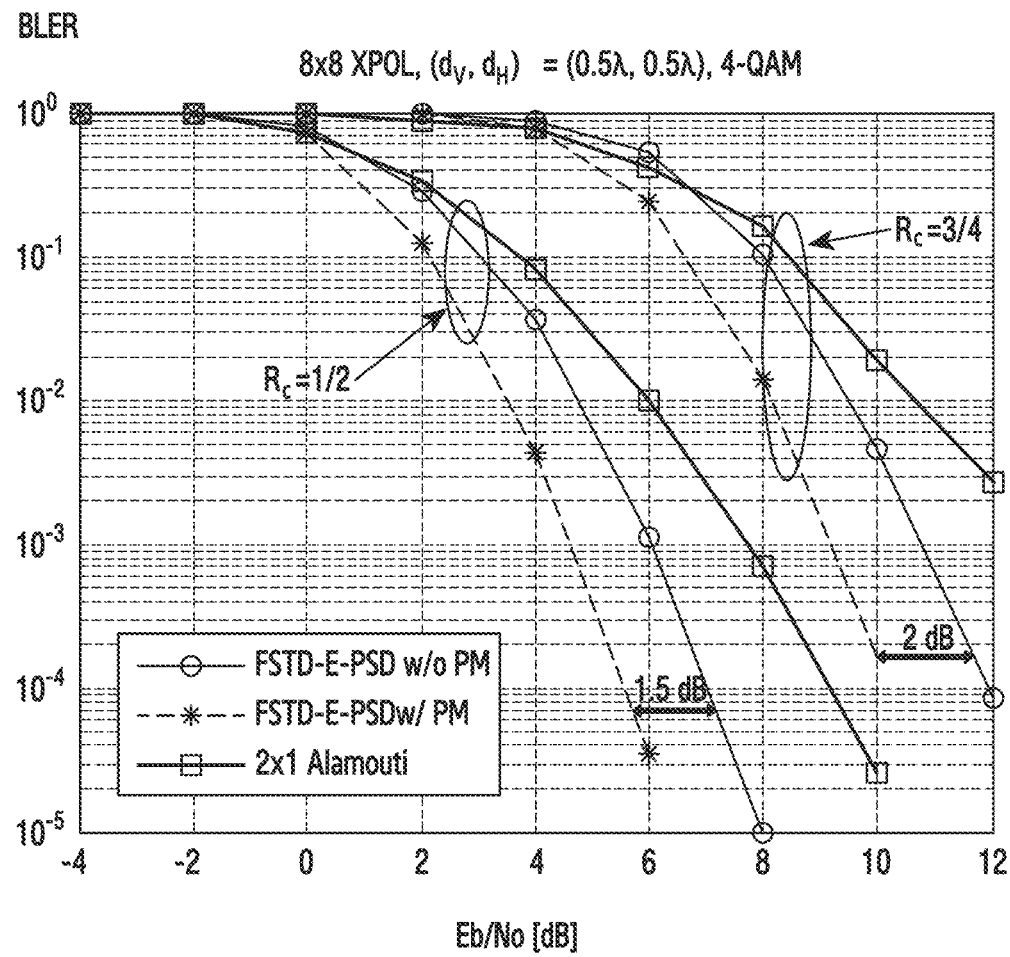

FIG. 28 illustrates a performance experiment result using the FSTD-E-PSD scheme in an environment where the transmission antenna arrangement is 8×8 and a vertical distance and a horizontal distance ($d_V$, $d_H$) between antennas is (0.5λ, 0.5λ). FIG. 28 also illustrates a BLER performance graph using an Alamouti code when the transmission antenna arrangement is 2×1 in order to present the criterion of the performance. Referring to FIG. 28, in both cases where a code rate $R_C$ is ½ and ¾, a lower BLER is acquired when the proposed permutation scheme is applied in most intervals. In an 8×8 antenna environment, unlike FIG. 27, it is possible to separate eight antennas in the FSTD-E-PSD scheme. According to an embodiment, a performance gain of the proposed permutation scheme is about 1.5 dB to 2 dB.

Figure 29:
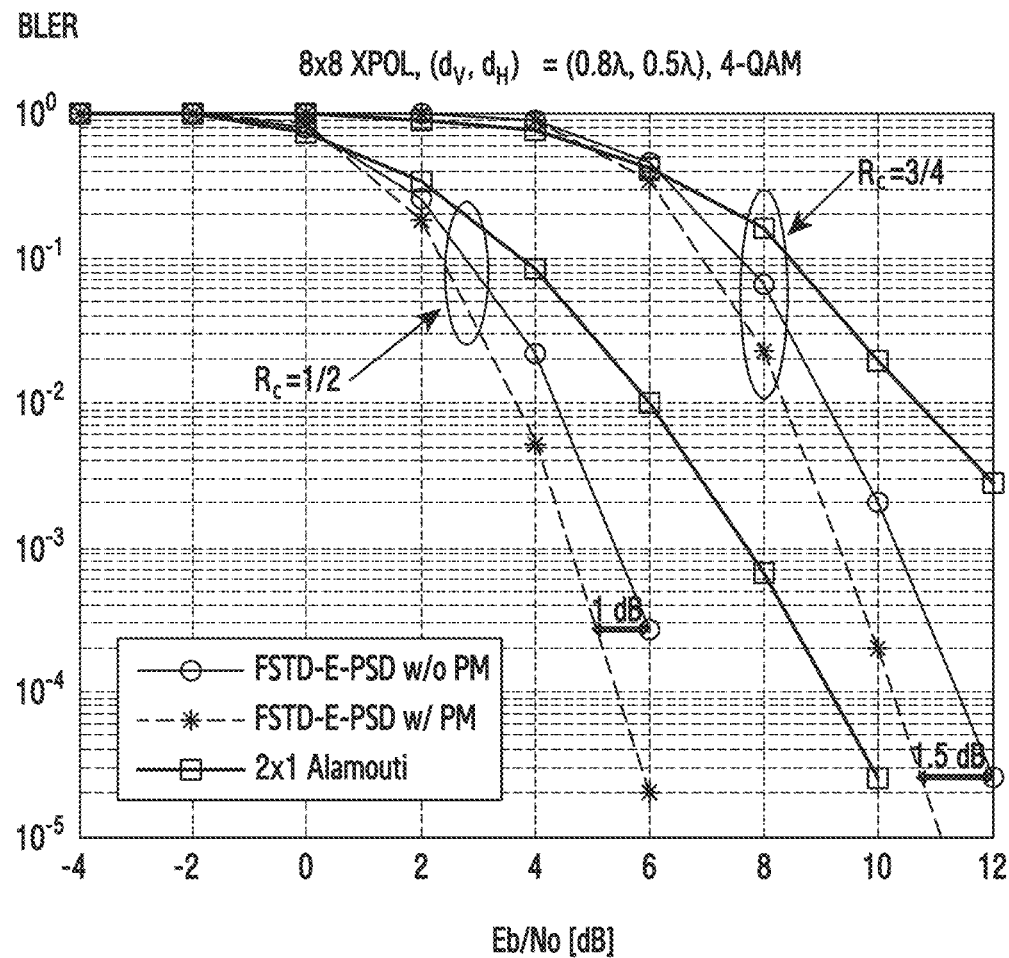

FIG. 29 illustrates a performance experiment result using the FSTD-E-PSD scheme in an environment where the transmission antenna arrangement is 8×8 and a vertical distance and a horizontal distance ($d_V$, $d_H$) between antennas is (0.8λ, 0.5λ). FIG. 29 also illustrates a BLER performance graph using an Alamouti code when the transmission antenna arrangement is 2×1 in order to present the criterion of the performance. Referring to FIG. 29, in both cases where a code rate $R_C$ is ½ and ¾, a lower BLER is acquired when the proposed permutation scheme is applied in most intervals. According to an embodiment, a performance gain of the proposed permutation scheme is about 1 dB to 1.5 dB.

Referring to FIGS. 27 to 29, the proposed permutation scheme may acquire a higher performance gain when the transmitting node has a larger number of antennas.

As a result, when the open-loop scheme, in which the transmitting node has a larger number of antennas and the larger number of antennas transmit one SFBC block, is used, the performance gain of the proposed permutation scheme may increase.

In the present disclosure, a specific operation described to be performed by the base station may be performed by an upper node than the base station according to some embodiments. That is, it is apparent that various operations performed for communication with the terminal can be performed by the base station or network nodes other than the base station in a network consisting of a plurality of network nodes including the base station.

Methods according to embodiments stated in claims and/or specifications of the present disclosure may be implemented in hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the present disclosure as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile Discs (DVDs), or other type optical storage devices, or a magnetic cassette. Alternatively, any combination of some or all of the may form a memory in which the program is stored. Further, a plurality of such memories may be included in the electronic device.

In addition, the programs may be stored in an attachable storage device which may access the electronic device through communication networks such as the Internet, Intranet, local area network (LAN), wide LAN (WLAN), and storage area network (SAN) or a combination thereof. Such a storage device may access the electronic device via an external port. Further, a separate storage device on the communication network may access a portable electronic device.

In the above-described detailed embodiments of the present disclosure, a component included in the present disclosure is expressed in the singular or the plural according to a presented detailed embodiment. However, the singular form or plural form is selected for convenience of description suitable for the presented situation, and various embodiments of the present disclosure are not limited to a single element or multiple elements thereof. Further, either multiple elements expressed in the description may be configured into a single element or a single element in the description may be configured into multiple elements.

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the embodiments, but should be defined by the appended claims and equivalents thereof.

What is claimed is:

1. A method of a transmitting node in a wireless communication system, the method comprising:
   determining a permutation matrix according to a block code scheme;
   generating symbols corresponding to a plurality of antennas based on the block code scheme and the permutation matrix; and
   transmitting the symbols to a receiving node through the plurality of antennas,
   wherein the permutation matrix is determined based on a number of blocks and an arrangement structure of the plurality of antennas, and
   wherein the number of blocks comprises a number of sub-blocks within a code block corresponding to the permutation matrix.

2. The method of claim 1, wherein each of the sub-blocks includes symbols that share time-frequency resources among the symbols.

3. The method of claim 1, wherein the plurality of antennas comprises a 2 dimensional (2D) planar array, and
   wherein the arrangement structure is determined based on
      a number of rows of antennas located in a vertical direction and a number of columns of the antennas located in a horizontal direction in the 2D planar array.

4. The method of claim 1, wherein the plurality of antennas is arranged such that multiple antennas having different polarities are located at one position.

5. The method of claim 1, wherein the permutation matrix maximizes a minimum distance between antennas used for transmitting a sub-block of the sub-blocks.

6. The method of claim 1, wherein determining the permutation matrix comprises calculating the permutation matrix to maximize a minimum distance between antennas used for transmitting each of the sub-blocks.

7. The method of claim 6, wherein calculating the permutation matrix comprises:
determining a horizontal interval and a vertical interval that configure a minimum distance between two antennas maximum within the sub-blocks; and
determining a combination of positions of antennas for each of the sub-blocks based on the determined horizontal interval and vertical interval.

8. The method of claim 1, wherein the permutation matrix configures polarities of antennas having a minimum distance that is different among antennas used for transmitting a sub-block.

9. The method of claim 1, wherein determining the permutation matrix comprises calculating the permutation matrix to configure antennas having a minimum distance and different polarities among antennas used for transmitting each of the sub-blocks.

10. The method of claim 1, wherein the block code scheme is determined based on a frequency shift transmit diversity (FSTD) scheme in which space frequency block code (SFBC) blocks are orthogonally arranged on a frequency domain.

11. An apparatus of a transmitting node in a wireless communication system, the apparatus comprising:
at least one processor configured to determine a permutation matrix according to a block code scheme; and
a transceiver configured to:
generate symbols corresponding to a plurality of antennas based on the block code scheme and the permutation matrix; and
transmit the symbols to a receiving node through the plurality of antennas,
wherein the permutation matrix is determined based on a number of blocks and an arrangement structure of the plurality of antennas, and
wherein the number of blocks comprises a number of sub-blocks within a code block corresponding to the permutation matrix.

12. The apparatus of claim 11, wherein each of the sub-blocks includes symbols that share time-frequency resources among the symbols.

13. The apparatus of claim 11, wherein the plurality of antennas comprises a 2 dimensional (2D) planar array, and wherein the arrangement structure is determined based on a number of rows of antennas located in a vertical direction and a number of columns of antennas located in a horizontal direction in the 2D planar array.

14. The apparatus of claim 11, wherein the plurality of antennas is arranged such that multiple antennas having different polarities are located at one position.

15. The apparatus of claim 11, wherein the permutation matrix maximizes a minimum distance between antennas used for transmitting a sub-block of the sub-blocks.

16. The apparatus of claim 11, wherein the at least one processor is further configured to calculate the permutation matrix to maximize a minimum distance between antennas used for transmitting each of the sub-blocks.

17. The apparatus of claim 16, wherein the at least one processor is further configured to:
determine a horizontal interval and a vertical interval that configure a minimum distance between two antennas maximum within the sub-blocks; and
determines a combination of positions of antennas for each of the sub-blocks based on the determined horizontal interval and vertical interval.

18. The apparatus of claim 11, wherein the permutation matrix configures polarities of antennas having a minimum distance that is different among antennas used for transmitting a sub-block.

19. The apparatus of claim 11, wherein the at least one processor is further configured to calculate the permutation matrix to configure antennas having a minimum distance and different polarities among antennas used for transmitting each of the sub-blocks.

20. The apparatus of claim 11, wherein the block code scheme is determined based on a frequency shift transmit diversity (FSTD) scheme in which space frequency block code (SFBC) blocks are orthogonally arranged on a frequency domain.

* * * * *